United States Patent
Bin Hud et al.

(10) Patent No.: US 12,368,054 B2
(45) Date of Patent: Jul. 22, 2025

(54) LEAD FRAME ROLLING

(71) Applicant: Texas Instruments Incorporated, Dallas, TX (US)

(72) Inventors: Amirul Afiq Bin Hud, Melaka (MY); Sueann Wei Fen Lim, Melaka (MY); Adi Irwan Bin Herman, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/738,068

(22) Filed: Jan. 9, 2020

(65) Prior Publication Data
US 2021/0217630 A1     Jul. 15, 2021

(51) Int. Cl.
| H01L 21/48 | (2006.01) |
| H01L 21/56 | (2006.01) |
| H01L 23/31 | (2006.01) |
| H01L 23/495 | (2006.01) |

(52) U.S. Cl.
CPC .......... *H01L 21/4842* (2013.01); *H01L 21/56* (2013.01); *H01L 23/3107* (2013.01); *H01L 23/49503* (2013.01); *H01L 23/49548* (2013.01)

(58) Field of Classification Search
CPC ............... H01L 21/4842; H01L 21/561; H01L 2224/743; H01L 21/56; H01L 23/3107; H01L 23/49503; H01L 23/49548
USPC ........ 438/111, 121, 123, 127, 660; 257/666, 257/676, 696, 775, E23.054, E23.124
See application file for complete search history.

(56) References Cited

U.S. PATENT DOCUMENTS

| 4,020,725 | A | * | 5/1977 | Climo | ...................... B26F 1/10 83/349 |
| 4,117,296 | A | * | 9/1978 | Becker | ................. B23K 11/163 219/113 |
| 5,371,943 | A | * | 12/1994 | Shibata | ............... H01L 21/4842 257/E23.046 |
| 5,691,241 | A | * | 11/1997 | Kazutaka | ............ H01L 21/4842 257/676 |

(Continued)

FOREIGN PATENT DOCUMENTS

| JP | 61051862 A | * | 3/1986 | ....... H01L 23/49548 |
| JP | 08213528 A | * | 8/1996 | |
| WO | WO-2008062992 A1 | * | 5/2008 | ........... B21C 37/045 |

OTHER PUBLICATIONS

JPS6151862A English Translation (Year: 1986).*

*Primary Examiner* — David Chen
(74) *Attorney, Agent, or Firm* — Yudong Kim; Frank D. Cimino

(57) ABSTRACT

A method includes rolling a roller with a protrusion across a lead frame to create an indent in a feature of the lead frame, attaching a die to a die attach pad of the lead frame, coupling the die with a lead, and enclosing portions of the die, the die attach pad, and portions of the lead frame feature with a molding compound. A system includes a roller with a cylindrical body and a protrusion, a chuck to engage a lead frame, and a controller to roll the roller across the lead frame to create an indent in a feature of the lead frame. An integrated circuit includes a package structure enclosing a first portion of a lead and a first portion of a die attach pad, and a rolled indent in the first portion of the lead or the die attach pad.

26 Claims, 19 Drawing Sheets

(56) References Cited

U.S. PATENT DOCUMENTS

| | | | |
|---|---|---|---|
| 6,501,156 B1* | 12/2002 | Nakanishi | H01L 23/49503 |
| | | | 257/676 |
| 2005/0079653 A1* | 4/2005 | Schrock | H01L 23/4951 |
| | | | 438/118 |
| 2007/0052070 A1* | 3/2007 | Islam | H01L 24/97 |
| | | | 257/E23.037 |
| 2010/0244210 A1* | 9/2010 | Fukushima | H01L 23/49548 |
| | | | 257/670 |
| 2011/0094085 A1* | 4/2011 | Sakurai | B21H 8/00 |
| | | | 29/527.1 |
| 2014/0191380 A1 | 7/2014 | Lee et al. | |
| 2017/0053814 A1 | 2/2017 | Fen et al. | |
| 2018/0247883 A1* | 8/2018 | Imori | H01L 23/49537 |

\* cited by examiner

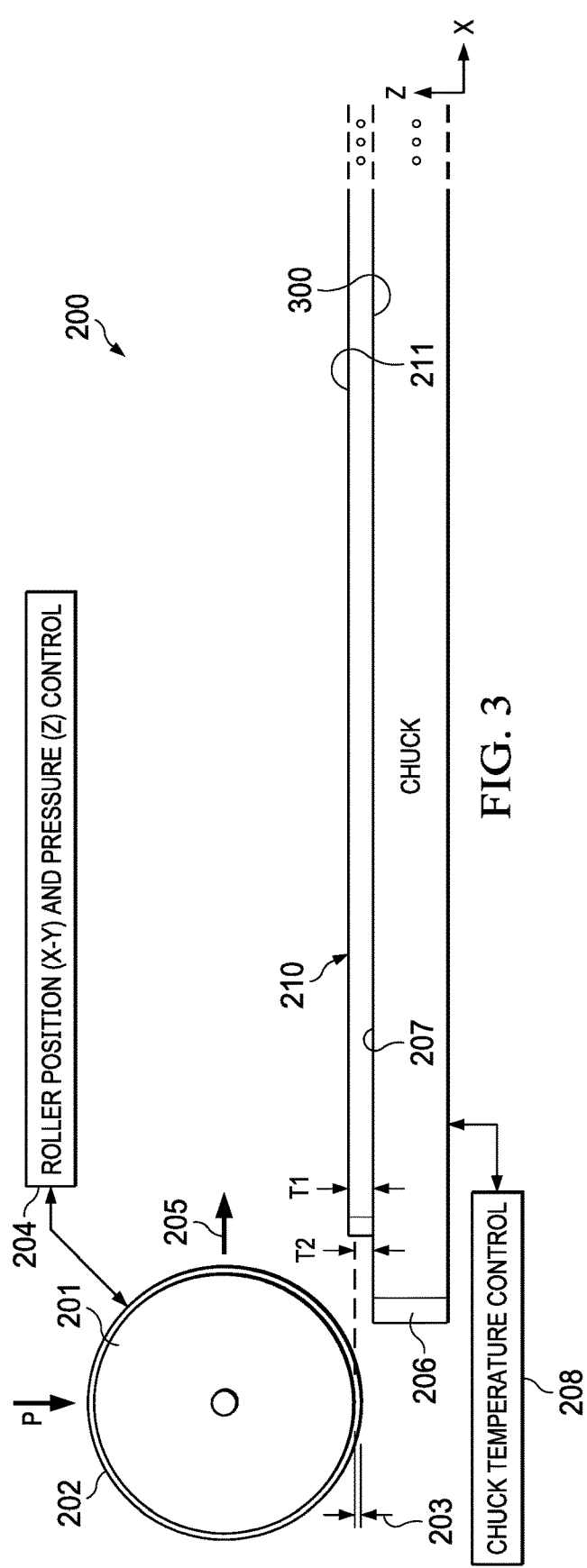
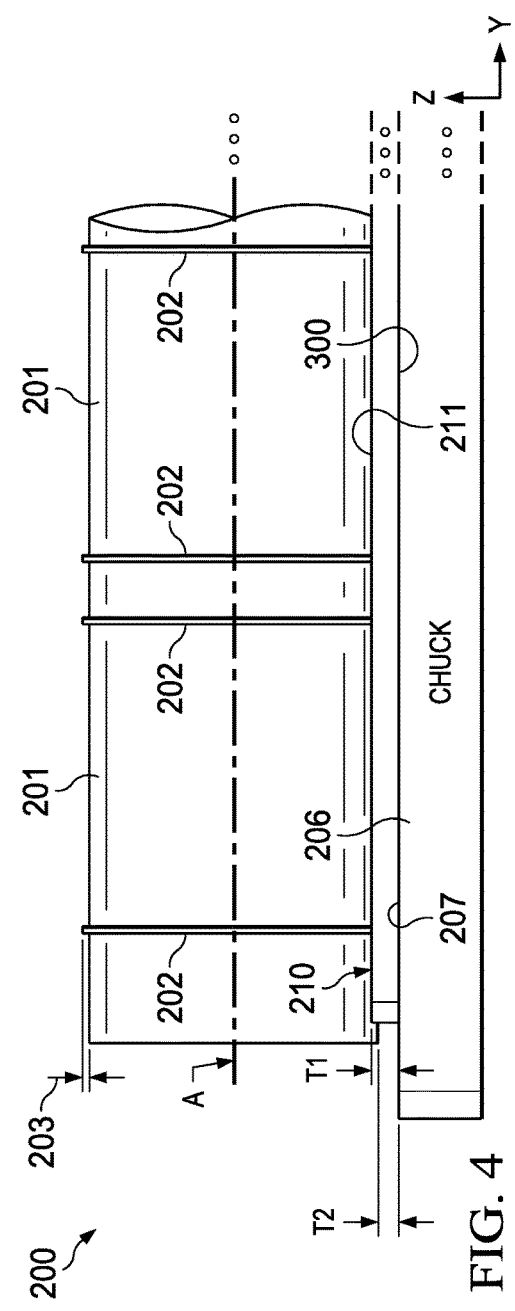
FIG. 3
FIG. 4

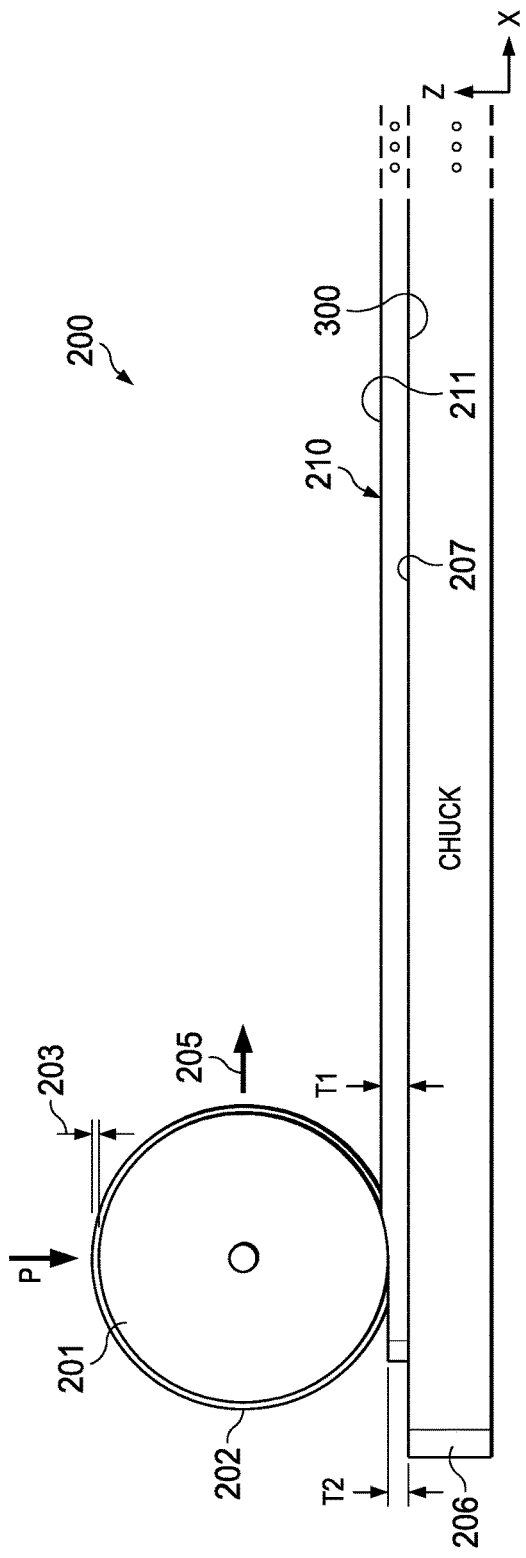
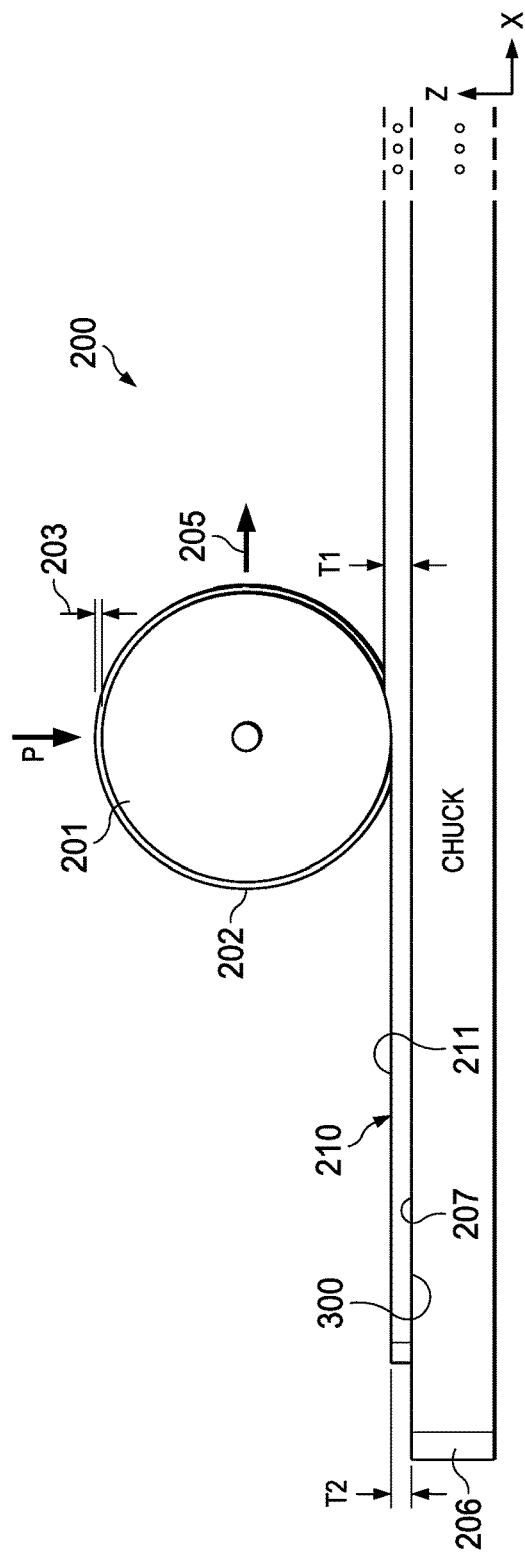

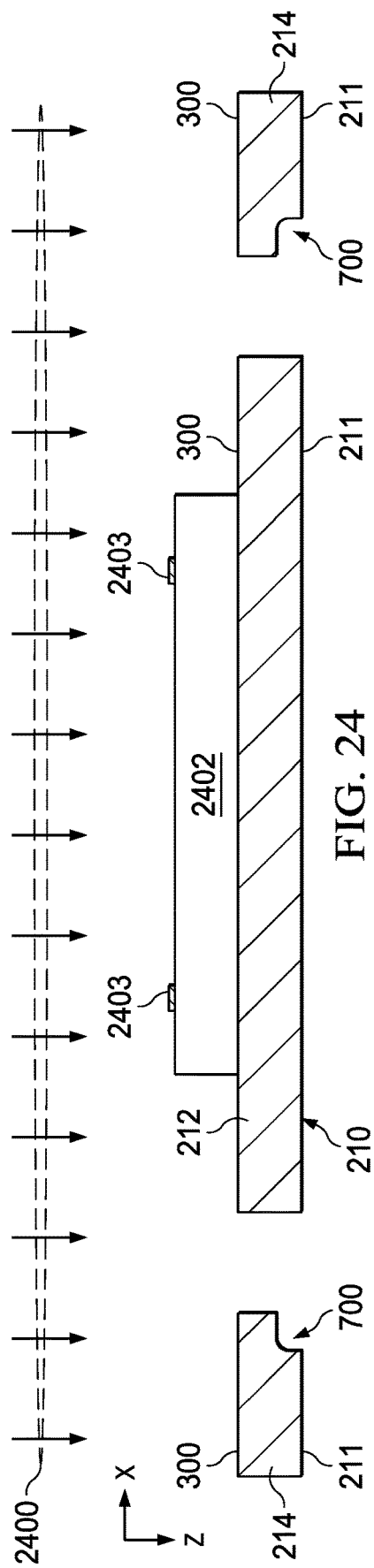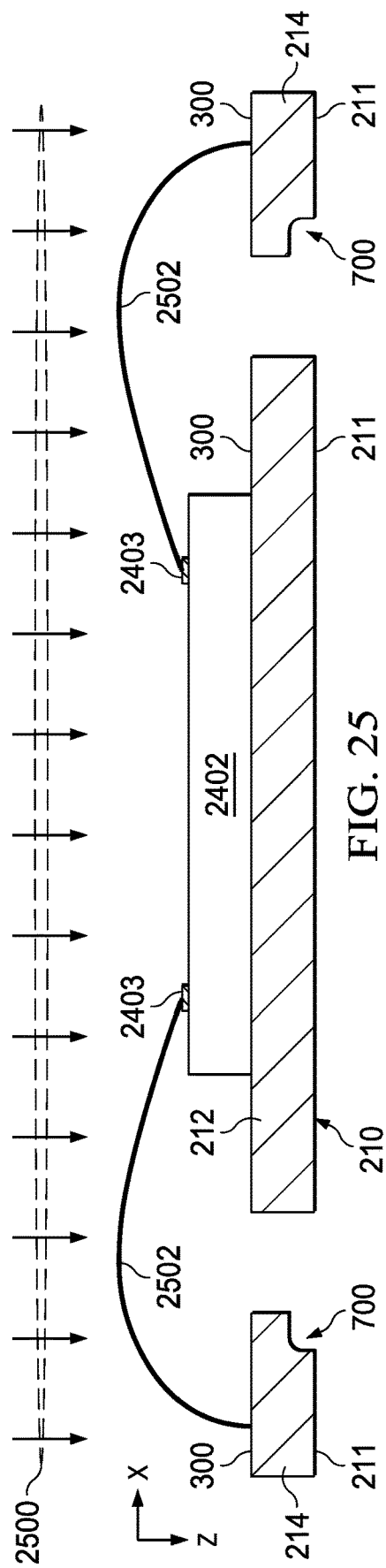

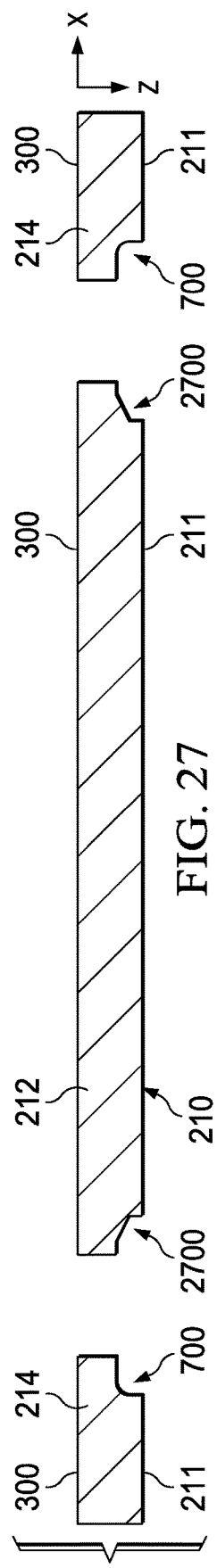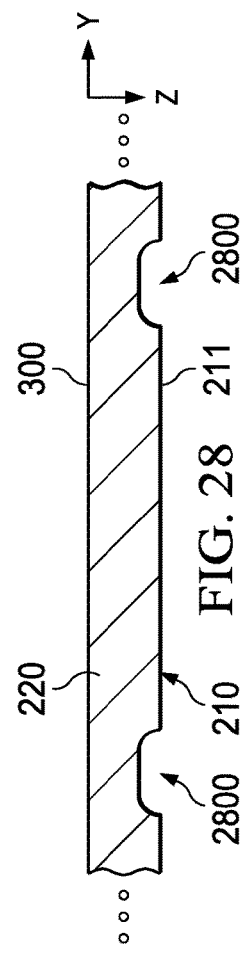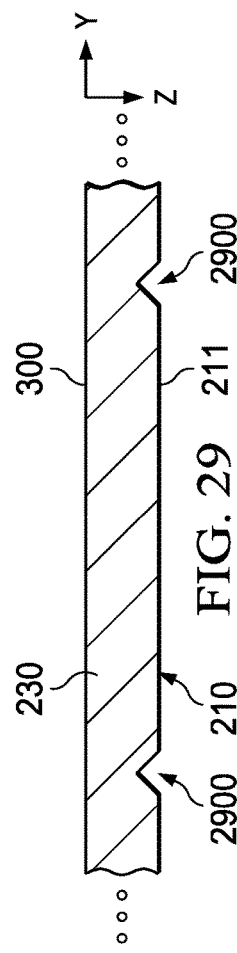

LEAD FRAME ROLLING

BACKGROUND

Packaged electronic devices, such as integrated circuits with multiple electronic components in a package structure and individually packaged electronic components are often constructed using a starting lead frame having one or more lead frame features. Example lead frame features include one or more die attach pads for mounting semiconductor dies, lead features for creating externally accessible leads for soldering the finished device to a host circuit board, as well as tie bars and/or dam bars used for various functions during manufacturing. In one example, an integrated circuit includes a semiconductor die mounted to a die attach pad, along with bond wires connected between die pads of the semiconductor die and corresponding leads. After wire bonding, the assembly is molded using a molding compound, and individual devices are separated from a lead frame panel or strip to provide individual packaged electronic devices. The molding process encloses all or portions of the various components to provide a package structure for mechanical integrity of the product, as well as to seal the internal components.

The seal integrity, as well as the mechanical rigidity can be adversely affected by separation or delamination of the molding compound from the semiconductor die and/or from the die attach pad and leads of the original starting lead frame. Delamination can be caused by different factors, including lead frame manufacturing variations in dimensions or surface imperfections. Starting lead frames are typically provided in a panel or strip that includes many sectors that individually correspond to prospective packaged electronic devices. Various lead frame features are created by etching through or into select portions of the lead frame, or by stamping processes. Etched lead frame surfaces provide better adherence to molding compound than do stamped lead frame surfaces.

Various techniques are available to roughen the surface of a lead frame strip to enhance adherence to molded package materials and reduce the likelihood of delamination. At the same time, bond wires are often attached to certain lead frame features to provide electrical interconnection between leads and semiconductor dies. Accordingly, robust mechanical interconnection and low resistance electrical connection are important for certain portions of a lead frame. Plating steps can be used to selectively plate the surface of a lead frame to enhance electrical conductivity, such as plating a silver (Ag) lead finish, a nickel-palladium (NiPd) lead finish, a nickel-palladium-gold (NiPdAu) lead finish, etc. However, plated materials that enhance solderability typically reduce adherence to molding compound materials.

Additional processes can be used to roughen certain portions of the lead frame that are ultimately destined for contact with molding compound, but this approach is expensive. Certain portions of a starting lead frame can be selectively etched to provide interlocking shapes for mechanical adherence to subsequent lead molded materials, but selective etching is expensive due to the cost of additional chemicals and masks. In addition, such etching is typically limited to thin lead frames, such as less than or equal to 25 mills. Another approach is stamping to provide locking shapes, but this technique is expensive in initial investment for stamp tooling and customized inserts and may be impractical for unique lead frame shapes. For example, a stamped lead frame tool can cost hundred thousand dollars or more, and lead time for obtaining new stamping tools can be months, making fast lead frame changes impractical.

SUMMARY

According to one aspect, a method includes rolling a roller with a protrusion across a lead frame to create an indent in a feature of the lead frame. In one example, the method further includes attaching a die to a die attach pad of the lead frame, coupling the die with a lead, and enclosing portions of the die, the die attach pad, and portions of the lead frame feature with a molding compound. In one example, the method also includes engaging the lead frame to a chuck and controlling the chuck temperature during rolling. The method in one implementation includes rolling a side of the lead frame in multiple directions using the same or different rollers. In one example, two sides of the lead frame are rolled. The method in one implementation further includes controlling and applied pressure of the roller to set a final thickness of the lead frame.

Another aspect provides a system that includes a roller with a cylindrical body and a protrusion, a chuck to engage a lead frame, and a controller to roll the roller across the lead frame to create an indent in a feature of the lead frame. In one example, the system also includes a temperature controller that controls a chuck temperature during rolling. One implementation also includes a controller that controls and applied pressure of the roller during rolling. In one example, the roller includes two or more protrusions. In one example, the protrusion of the roller includes discontinuities.

In a further aspect, an integrated circuit includes a package structure enclosing a first portion of a lead and a first portion of a die attach pad, and a rolled indent in the first portion of the lead or the die attach pad. In one example, the indent is formed in the lead of the integrated circuit. In another example, the indent is formed in the die attach pad. In one implementation, the indent is formed in an upper side of the lead or die attach pad.

BRIEF DESCRIPTION OF THE DRAWINGS

FIG. 3 is a partial side elevation view of the lead frame processing system of FIG. 2 with the roller in the first position.

FIG. 4 is a partial end elevation view of the lead frame processing system of FIG. 2 with the roller in the first position.

FIG. 6 is a partial side elevation view of the lead frame processing system of FIG. 2 with the roller in the second position.

FIG. 8 is a partial side elevation view of the lead frame processing system of FIG. 2 with the roller in the third position.

FIG. 24 is a partial side elevation view of a die attach process that attaches a semiconductor die to a top surface of the lead frame of FIG. 13.

FIG. 25 is a partial side elevation view of a wire bonding process that interconnects conductive die pads of the semiconductor die to corresponding leads.

FIG. 27 is a partial sectional side elevation view of a lead frame with a rolled indent in a first portion of a die attach pad feature of the lead frame.

FIG. 28 is a partial sectional side elevation view of a lead frame with a rolled indent in a dam bar feature of the lead frame.

FIG. 29 is a partial sectional side elevation view of a lead frame with a rolled indent in a tie bar feature of the lead frame.

DETAILED DESCRIPTION

Figure 1:
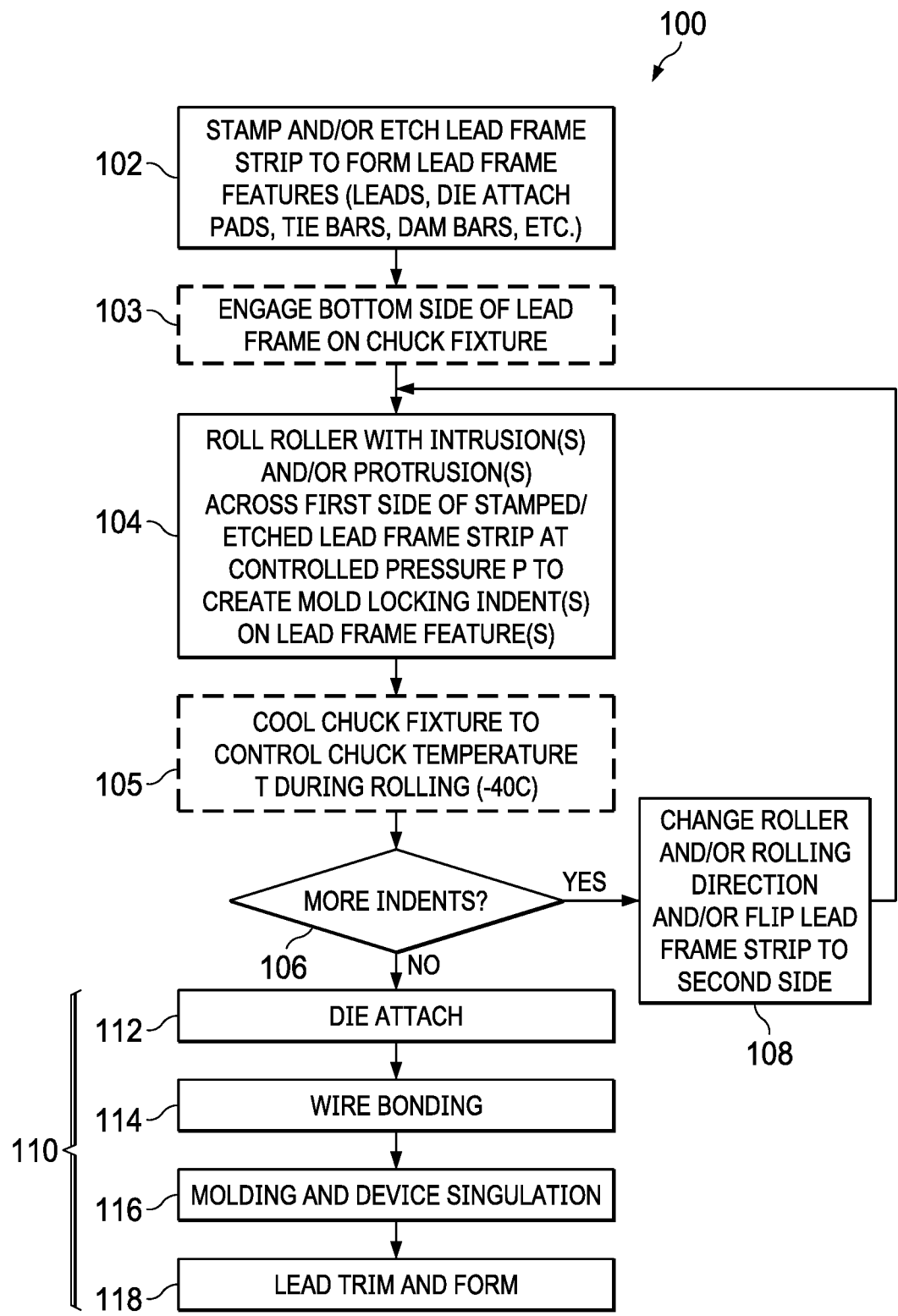
FIG. 1 is a flow diagram of a method to fabricate an electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled to a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows an example method 100 for fabricating an integrated circuit or other packaged electronic device. The method 100 has an included method for processing a stamped or etched lead frame to provide one or more indents or indented features. The method 100 begins at 102 with stamping or etching a lead frame strip (e.g., panel) to form one or more lead frame features. Suitable examples of lead frame features created at 102 include leads, die attach pads, tied bars, and/or dam bars. In one implementation, the stamping at 102 is omitted, and the method 100 begins with a starting lead frame that already includes the etched or stamped lead frame features. In one example, the lead frame strip is for leaded packages. In another example, the lead frame strip is for leadless packages. In one example, the starting lead frame as a length of 25-80 cm and a width of 150-300 cm.

The method 100 includes engaging a side of the lead frame at 103 on a chuck fixture. In one example, the top side of the lead frame is engaged on a top side of the chuck and is clamped to the chuck at 103 in a fixed position to allow alignment with a roller to perform a rolling operation on the bottom (e.g., first) side of the lead frame, in which relative positions of the roller and the lead frame are controlled. The chuck in one example has a generally planar or flat top side configured to engage with a generally planar second side of an installed lead frame to allow control of a pressure applied by the roller to the lead frame during rolling. In one example, the chuck includes cooling coils, a controlled coolant supply, one or more temperature sensors, and a controller to control a temperature of the engaged side of the chuck during rolling.

The method 100 continues at 104 with rolling a roller across a first side of a stamped or etched lead frame to create an indent in a feature of the lead frame. The roller can be any size depending on the lead frame/package configuration, such as 5-50 cm in diameter and 25-80 cm in length. The roller includes high and low portions, with a cylindrical body that extends along an axis. A surface of the cylindrical body is radially spaced from the axis, and the roller has one or more protrusions that extend radially outward from the cylindrical body to create rolled indents (e.g., indented mold locking features) in the rolled side of the lead frame. In one example, the rolling at 104 includes controlling a downward pressure P applied by the roller to the first side of the lead frame to set a final thickness of the lead frame that is less than a starting thickness of the lead frame. The roller provides rolled indent features in one or both sides of the lead frame and provides the ability to create unique mold locking or anchoring structures that cannot be created by lead frame etching or lead frame stamping operations.

In one example, method 100 includes controlling a temperature T of the chuck at 105 while rolling the roller across the first side of the lead frame. In one example, a coolant is flowed through cooling tubes of the chuck supporting the lead frame during rolling to control the chuck temperature to a desired value, such as −40° C. in one implementation. In another implementation, the temperature control at 105 is omitted. As the roller applies a controlled pressure to the first side of the lead frame, controlled cooling of the chuck maintains the temperature of the rolled lead frame. Cooling the lead frame mitigates warping or bending of the rolled lead frame during rolling.

At 106 in FIG. 1, the method 100 includes determining whether more indents (e.g., locking features) are desired for the installed lead frame. If so (YES at 106), the method includes changing to a different roller and/or rolling the initial roller in a different direction or on a different side of the lead frame at 108 to create additional indents in the lead frame at 104 and 105 as previously described. Different rollers, applied roller pressures P and/or chuck temperatures T can be used during any second or subsequent rolling steps. In one example, where one or more indents are desired for the second side of the lead frame, the lead frame is flipped, and the first side of the lead frame is engaged to the top side of the chuck fixture for rolling the second side. The same or a different roller is then rolled across the second side of the lead frame to create a second indent or a second side of indents in the same lead frame feature and/or in different lead frame features (e.g., mold locking features in lead features of a QFN package). In one example, different rollers are used having different protrusions or combinations thereof to create any desired indents on one or both sides of the lead frame. The roller protrusions in one example include discontinuities, for example, where the protrusions do not extend around the entire circumference of the cylindrical body of the roller.

If no further indents are desired (NO at 106), the method 100 proceeds to electronic device packaging steps at 110. At 112, the method includes attaching a semiconductor die to a die attach pad of the lead frame, for example, as described further below in connection with FIG. 24. The packaging processing also includes wire bonding at 114 to electrically couple a conductive feature (e.g., die pad) of the semiconductor die with a lead feature of the lead frame by connecting one or more bond wires, for example, as described further below in connection with FIG. 25. The packaging processing at 110 in FIG. 1 further includes molding and device separation or singulation at 116. The molding at 116 encloses portions of the semiconductor die, the die attach pad, and portions of the lead features of the lead frame with a molding compound, for example, as described further below in connection with FIG. 26. In one example, the device separation at 116 provides individual finished packaged electronic devices, such as quad flat no lead (QFN) packaged devices. In another example, the method 100 also includes lead trimming and forming at 118 to provide finished packaged electronic devices with gull-wing leads, J-type leads, etc.

Figure 2:
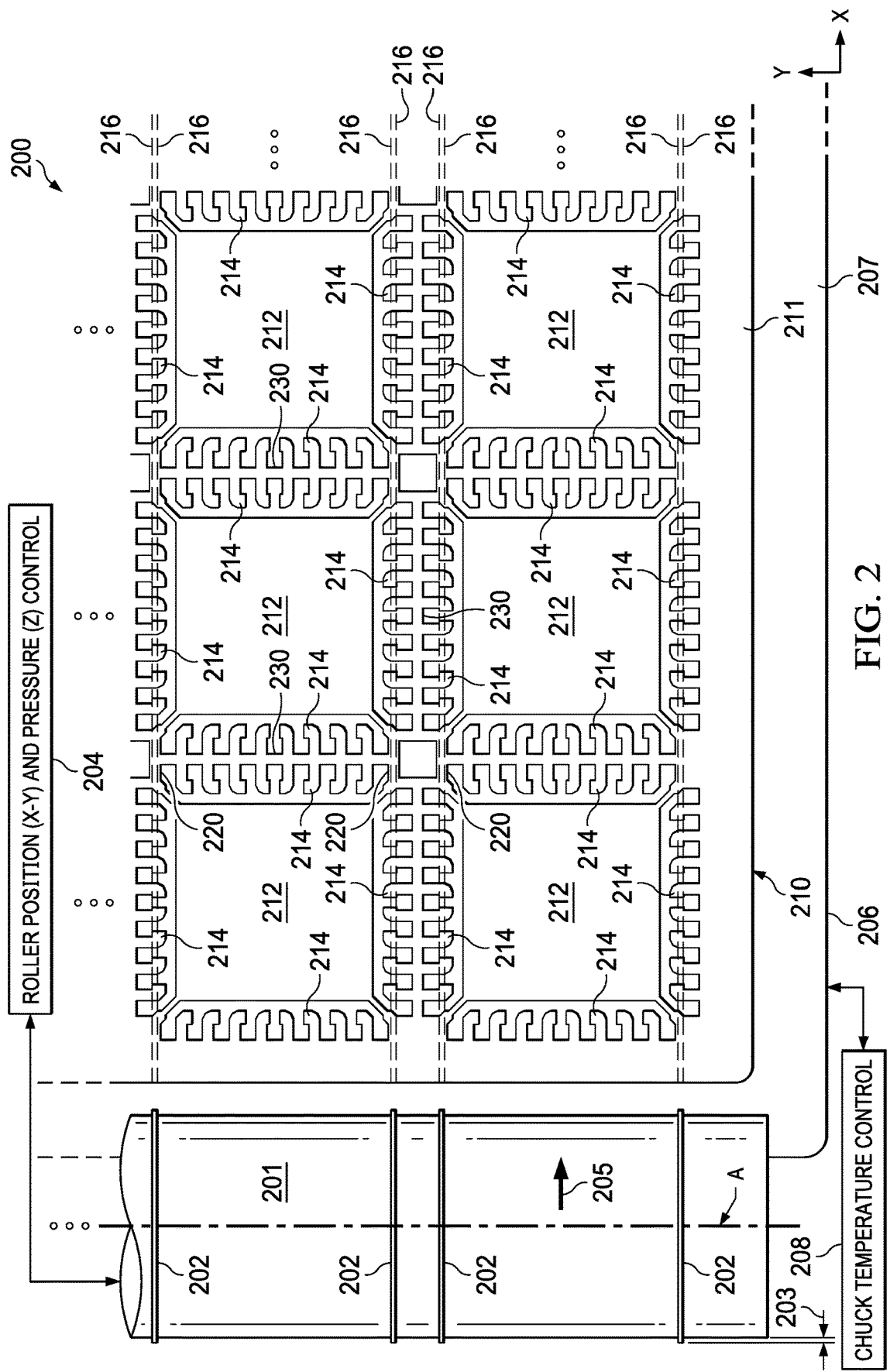
FIG. 2 is a partial top plan view of a lead frame processing system with a chuck supporting a lead frame, a roller in a first position prior to engaging the lead frame, and a position controller to roll the roller across the lead frame.

FIGS. 2-4 show an example lead frame processing system 200 that includes a roller 201 with a cylindrical body and several example protrusions 202. In another example, the roller includes a single protrusion. The cylindrical body is radially spaced from an axis A about which the roller 201 is rolled in operation. The protrusions 202 in this example extend in continuous fashion around the circumference of the cylindrical body of the roller 201. In another example, one or more of the protrusions 202 are discontinuous, and have one or more portions that extend only through a portion of the 360° circumference of the cylindrical body. The protrusions 202 extend radially outward from the cylindrical body by a first distance 203. In the illustrated example, all the protrusions 202 extend radially outward from the cylindrical body by the first distance 203. In another implementation, one or more of the individual protrusions 202 have different heights or spacing distances 203 throughout the 360° circumference of the cylindrical body. In another implementation, a first protrusion 202 extends radially outward by a first distance 203, and another protrusion 202 extends radially outward from the cylindrical body by a different distance. In different implementations, any combination of two or more protrusions are possible.

The system 200 includes a position controller 204 that is configured to control the position of the roller 201 in the illustrated X-Y plane. In one implementation, the position controller 204 controls the positioning of the roller 201 in the direction normal to the X-Y plane (e.g., in the Z direction in FIGS. 3 and 4). In one implementation, the position controller 204 includes robotic positioning arms (not shown) that support the roller 201 along the axis A and control translation of the roller 201 along a first direction 205 perpendicular to the axis A of the roller 201 in the X-Y plane. The position controller 204 in one example controls an applied pressure P of the roller 201 in the Z direction.

The system 200 further includes a chuck 206 having a generally planar top side 207 configured to engage a lead frame. The system 200 in one example also includes a chuck that is operatively a temperature controller 208 coupled to the chuck 206. The temperature controller 208 is configured to control the temperature of the chuck 206 (e.g., at 105 in FIG. 1 above) while the position controller 204 rolls the roller 201 in the direction 205. In one example, the chuck 206 includes cooling coils and a coolant source operated by the temperature controller 208 to control the flow of coolant through the cooling coils to control the temperature of the top side 207 of the chuck 206. Controlling the temperature T of the top side 207 of the chuck 206 controls an installed lead frame to mitigate or prevent warping or bending of the lead frame during rolling.

FIGS. 2-4 show an example lead frame 210 having a first (e.g., bottom) side 211 (shown in FIGS. 2-4) and an opposite second (e.g., top) side 300 (shown in FIGS. 3 and 4). The lead frame 210 in this example includes die attach pad features 212 and lead features 214. The lead frame 210 is a panel or strip that includes multiple prospective device sections arranged in rows and columns, six of which are shown in FIG. 2. The lead frame 210 is mounted on (e.g., engaged to or with) the top side 207 of the chuck 206 by clamping and/or X-Y alignment features of the chuck 206 (not shown). In this example, indented mold locking features or indents are desired on bottom side portions of lead features of the lead frame 210, and the roller 201 is rolled along the direction 205 to create bottom side indents in certain of the lead features 214 by alignment of the roller protrusions 202 along prospective rolling paths 216 shown in FIG. 2. In another example, one or more bottom side indents are desired on bottom side portions of the die attach pad features 212 of the lead frame 210, as discussed further below in connection with FIG. 27. The lead frame 210 in FIG. 2 also includes dam bar features 220 and tie bar features 230. In one implementation, bottom side indents are desired on top or bottom side portions of the dam bar features 220 and/or the tie bar features 230, as discussed further below in connection with FIGS. 28 and 29.

In operation, the position controller 204 in one example engages the cylindrical body and the protrusion 202 with the first side 211 of the lead frame 210 and positions the axis A of the roller 201 along the Y direction (FIGS. 2 and 4). FIGS. 2-4 show the roller 201 in a first position laterally outward of the left-most and of the lead frame 210 prior to engagement with the lead frame 210. As shown in the side views of FIGS. 3 and 4, the lead frame 210 has a starting thickness T1 (e.g., Z direction thickness), and the manufacturing design goal for the finished integrated circuit devices specifies a final lead frame thickness T2 that is less than the starting thickness T1.

The position controller 204 positions the axis A of the roller 201 such that the lowermost extent of the cylindrical body of the roller 201 is spaced from the top side 207 of the chuck 206 by the desired final lead frame thickness dimension T2. The roller position and pressure controller 204 in this example controls the Z direction position of the axis A of the roller 201 above the top side 207 of the chuck 206 during rolling in order to compress the material (e.g., copper) of the lead frame 210 to provide a rolled lead frame with the desired final thickness T2. In one example, the position controller 204 controls the applied pressure along the negative Z direction during rolling to achieve the desired final thickness T2 of the lead frame 210. The system 200 in one example includes X, Y, and Z position sensors (not shown) to provide feedback signals to the controller 204, as well as a pressure sensor or force sensor to provide feedback regarding the applied pressure P of the roller 201 along the Z direction. The controller 204 implements one or more closed control loops to provide rolling along the direction 205 in the X-Y plane as well as position control along the Z direction during rolling.

FIGS. 5-10 provide top and side views of the system 200 during rolling of the roller 201 across the first side 211 of the lead frame 210 along the first direction 205 to create a first set of indents along the prospective rolling paths 216 in certain lead features 214 of the first side 211 of the lead frame 210. The example lead frame 210 includes die attach pad features 212 and lead features 214 for several prospective integrated circuit devices, each of which having leads 214 along four sides thereof. The initial rolling in FIGS. 2-10 along the X-axis direction 205 provide mold locking indents (e.g., 700 in FIGS. 7, 9 and 11) in top and bottom rows of the lead features 214 of the first side 211 of the lead frame 210, which are formed by the rolling of the protrusions 202 along the rolling paths 216. The position controller 204 in one example controls the pressure applied by the roller 201 to the first side 211 of the lead frame 210 to maintain a constant spacing distance between the roller axis A and the top side 207 of the chuck 206 while rolling the roller 201 across the first side 211 of the lead frame 210 to set the final thickness T2 of the lead frame 210.

Figure 5:
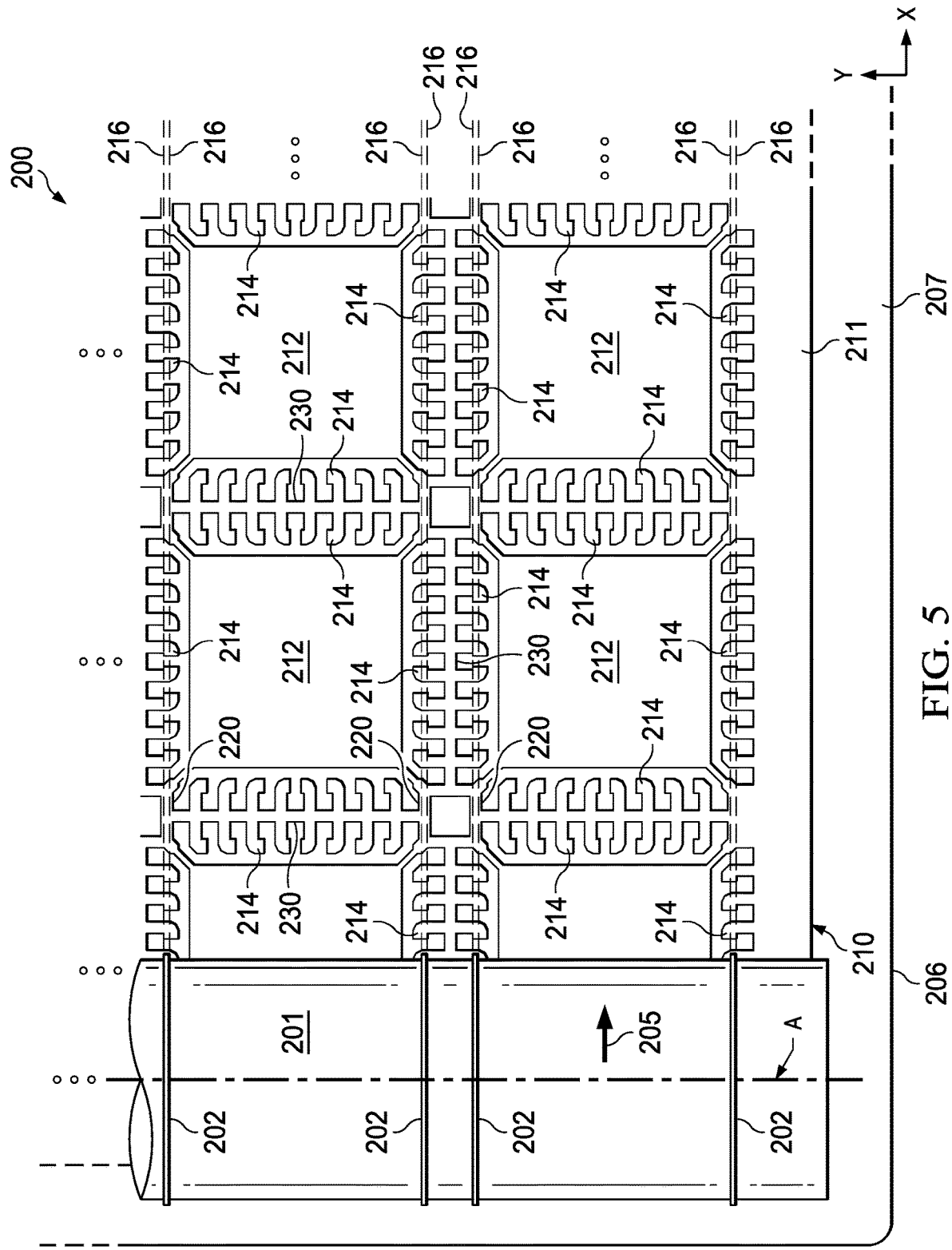
FIG. 5 is a partial top plan view of the lead frame processing system of FIG. 2 with the roller in a second position engaging a first lateral end of the lead frame while rolling in a first lateral direction to form a first set of indent features in leads of the bottom side of the lead frame.
Figure 7:
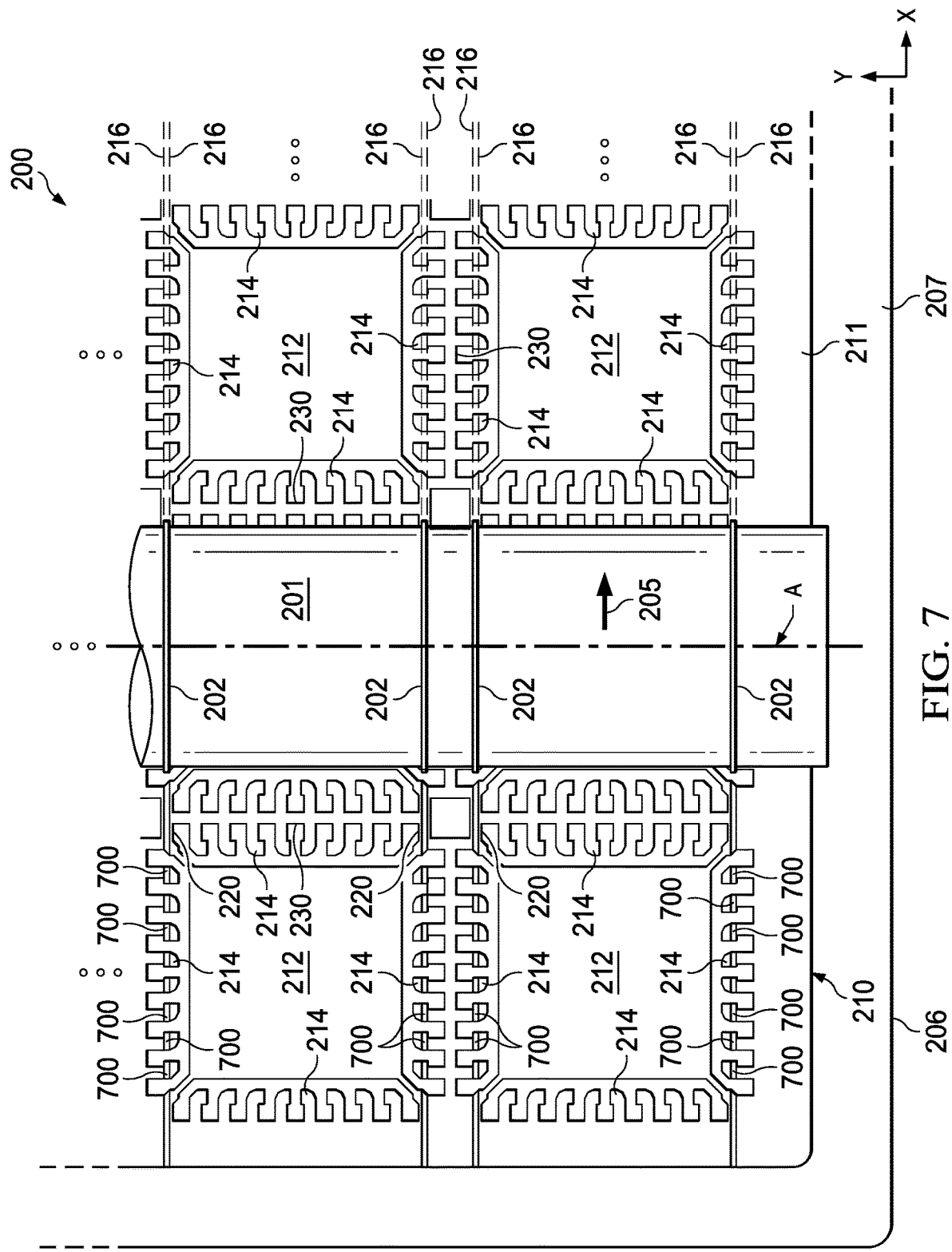
FIG. 7 is a partial top plan view of the lead frame processing system of FIG. 2 with the roller in a third position engaging a middle portion of the lead frame.
Figure 9:
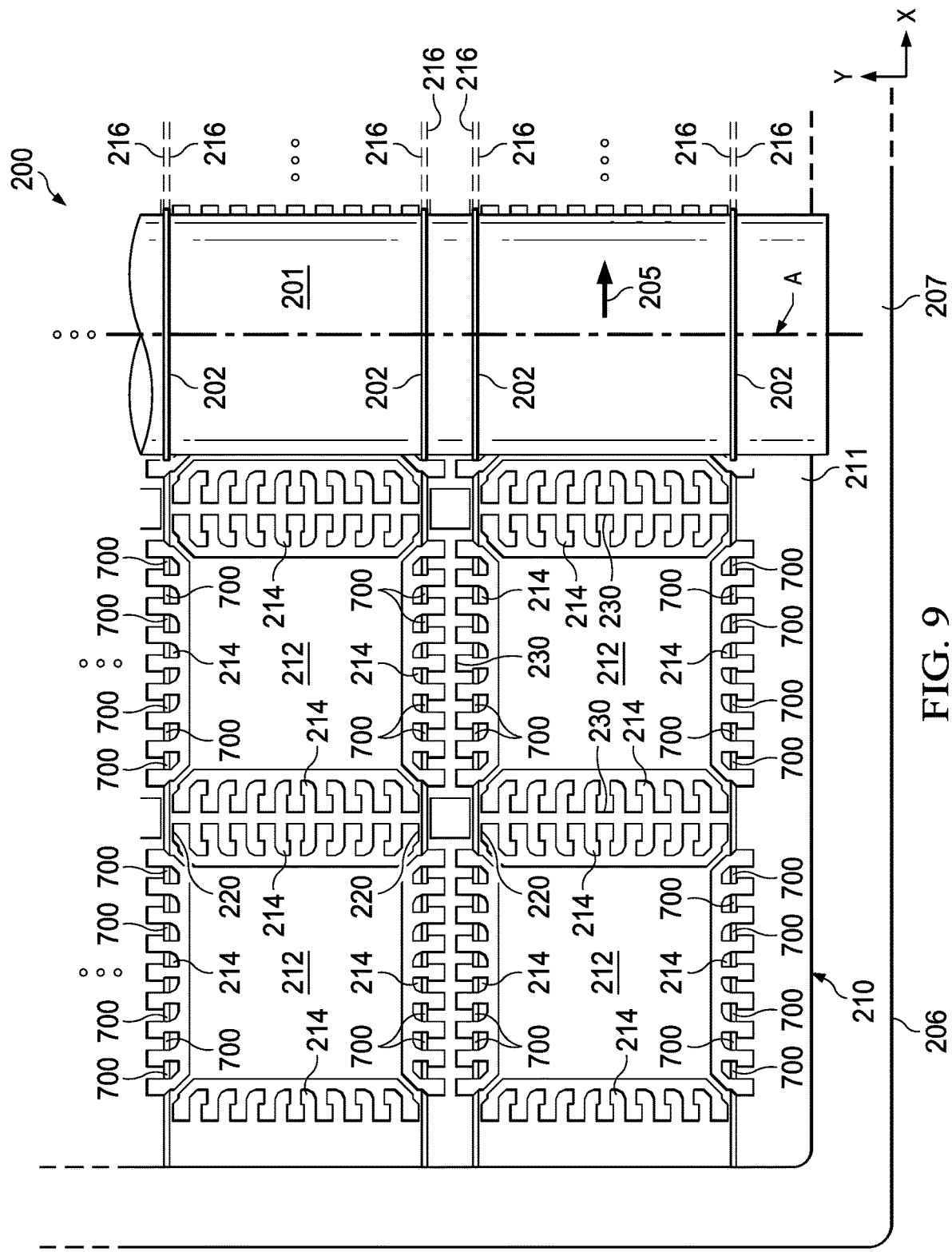
FIG. 9 is a partial top plan view of the lead frame processing system of FIG. 2 with the roller in a fourth position engaging the lead frame.
Figure 10:
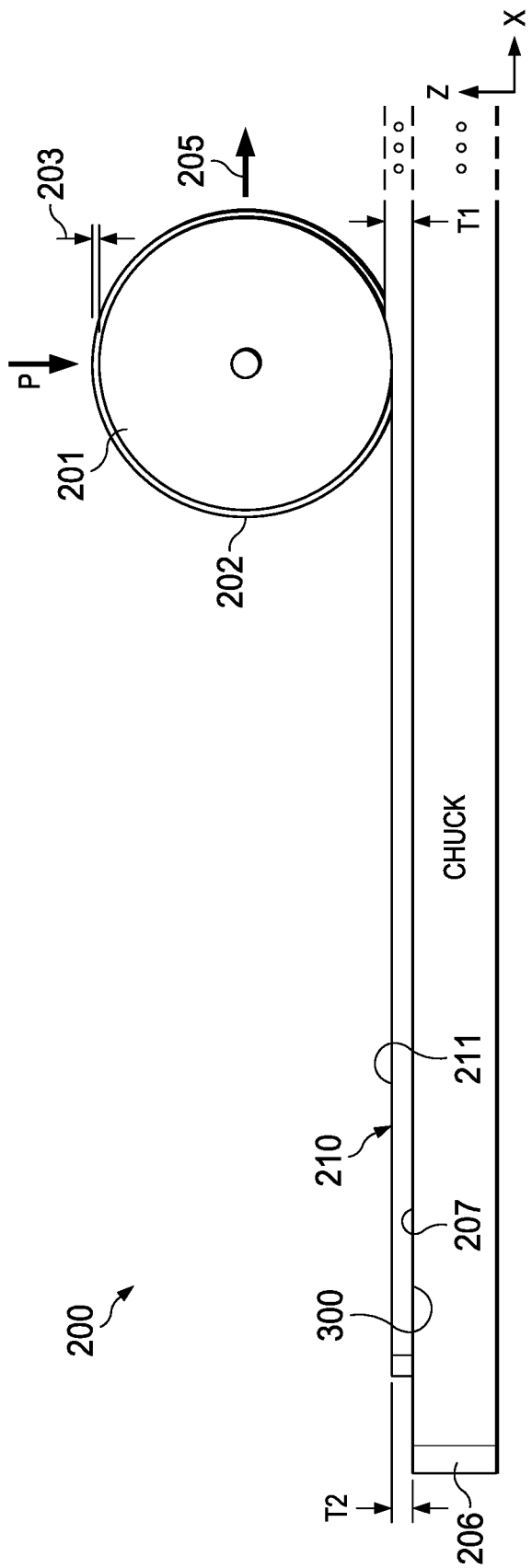
FIG. 10 is a partial side elevation view of the lead frame processing system of FIG. 2 with the roller in the fourth position.

FIGS. 5 and 6 show respective partial top and side view of the lead frame processing system 200 with the roller 201 in a second position engaged to or with a first lateral end of the lead frame 210 while rolling in the first lateral direction 205 to form a first set of indent features in leads 214 of the bottom side 211 of the lead frame 210. FIGS. 7 and 8 show respective partial top and side view of the system 200 with the roller 201 in a third position engaging a middle portion of the lead frame 210. The top view of FIG. 7 shows rolled indents 700 in the laterally arranged upper and lower lead features 214 in a first column of prospective device portions of the lead frame 210 after passage of the roller 201. FIGS. 9 and 10 show respective top and side views of the system 200 during continuation of the rolling operation in with the roller 201 in a fourth position engaging the lead frame 210.

Figure 11:
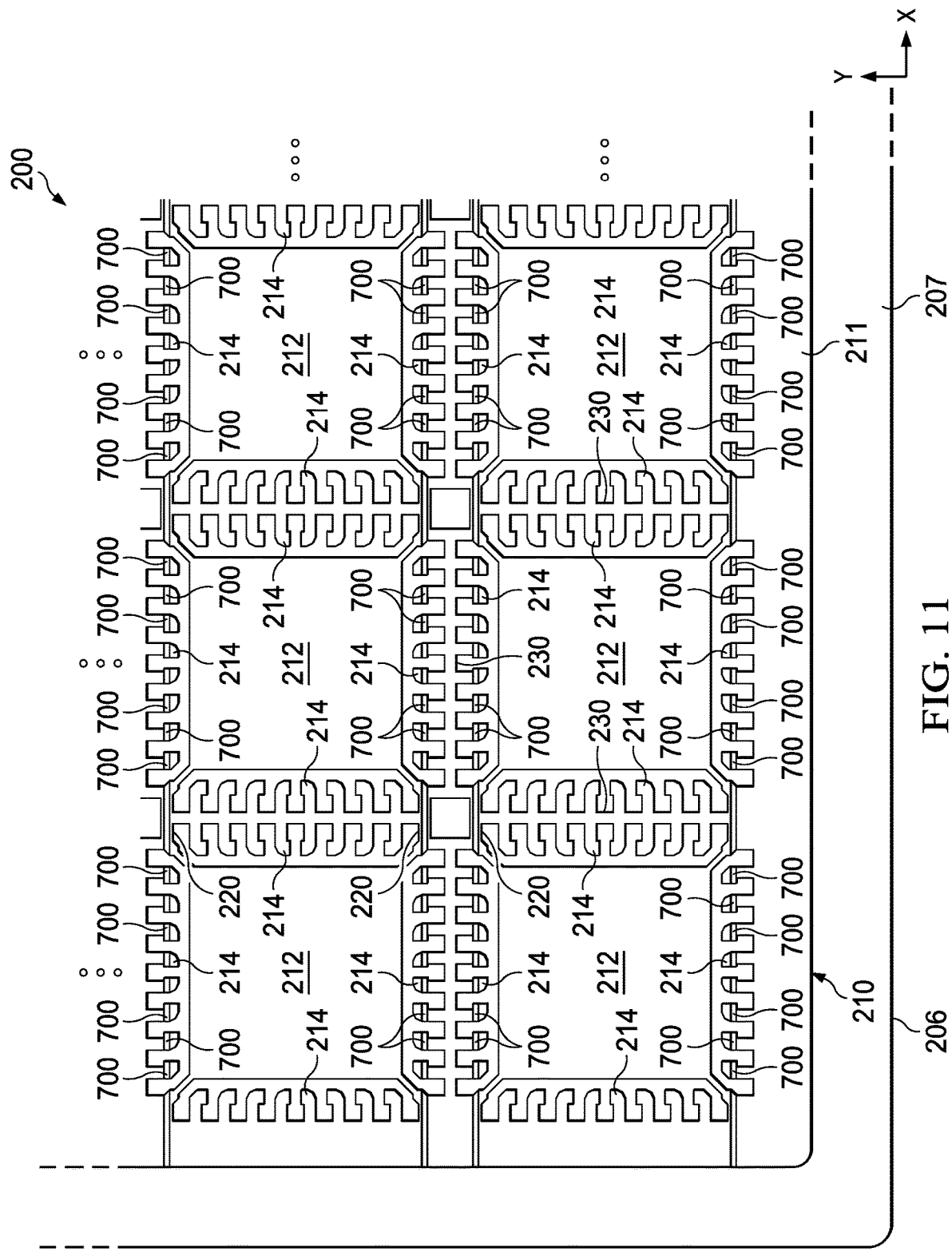
FIG. 11 is a partial top plan view of the lead frame processing system of FIG. 2 after the roller is rolled in the first lateral direction.

FIG. 11 shows a portion of the lead frame 210 after the roller 201 completes the rolling in the first lateral direction (X). The rolled indents 700 have indented shapes or profiles that conform to the shapes of the corresponding roller protrusions 202, as described further below in connection with FIGS. 16-23. The system 200 allows roller protrusion designs to be made for any desired rolled indent shapes, depths and sizes. The protrusions 202 in one example are continuous throughout the circumference of the body of the roller 201, and create the desired rolled indents 700 in the laterally disposed upper and lower lead features 214 of the lead frame 210 along the respective roller protrusion paths 216 shown in FIGS. 2, 5, 7, and 9. In other examples, the roller includes protrusions having discontinuities, where the protruding portions do not extend throughout the entire circumferential 360° extent of the roller, as described further below in connection with FIGS. 14 and 15.

Figure 12:
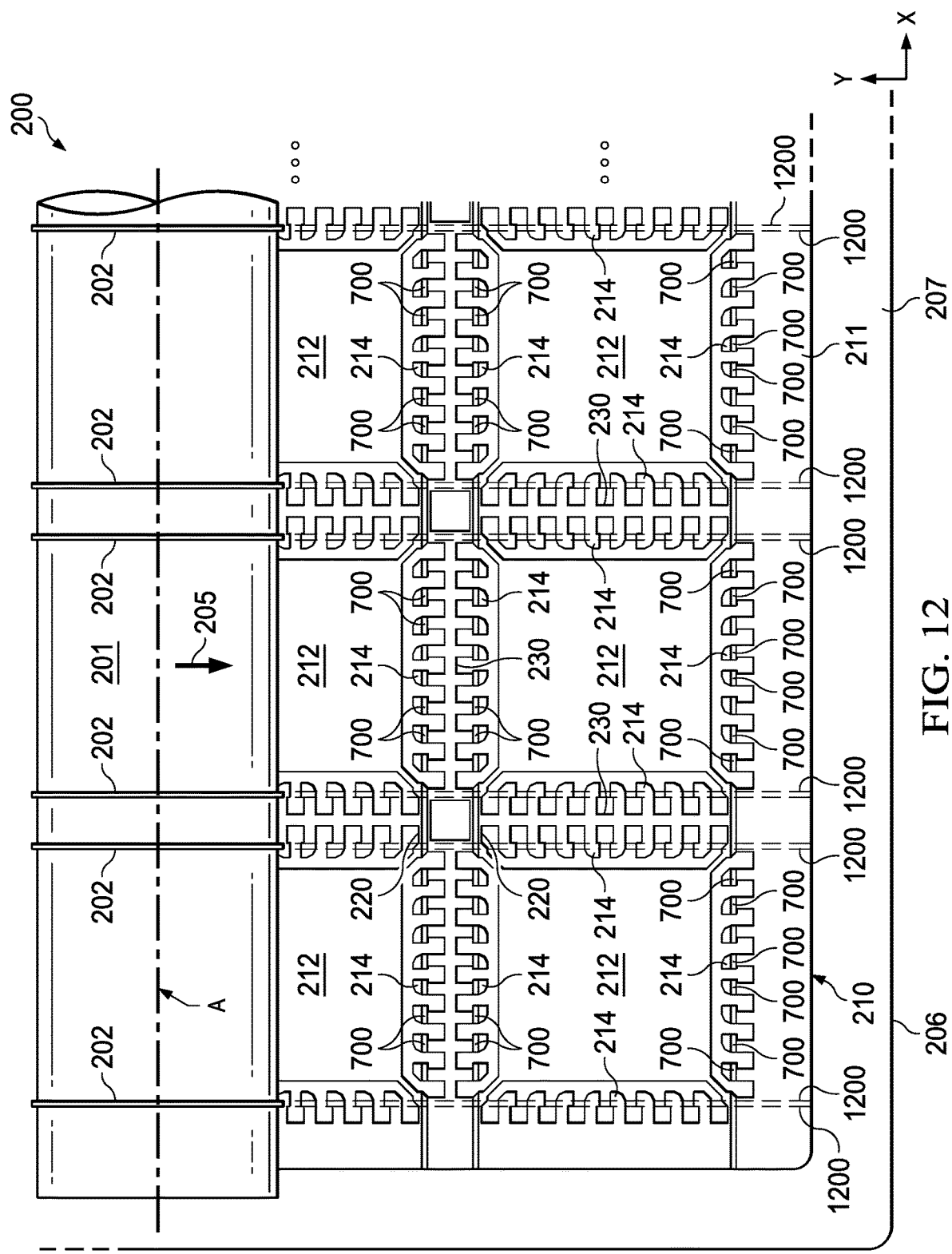
FIG. 12 is a partial top plan view of the lead frame processing system of FIG. 2 with the roller positioned for rolling in a second direction.
Figure 13:
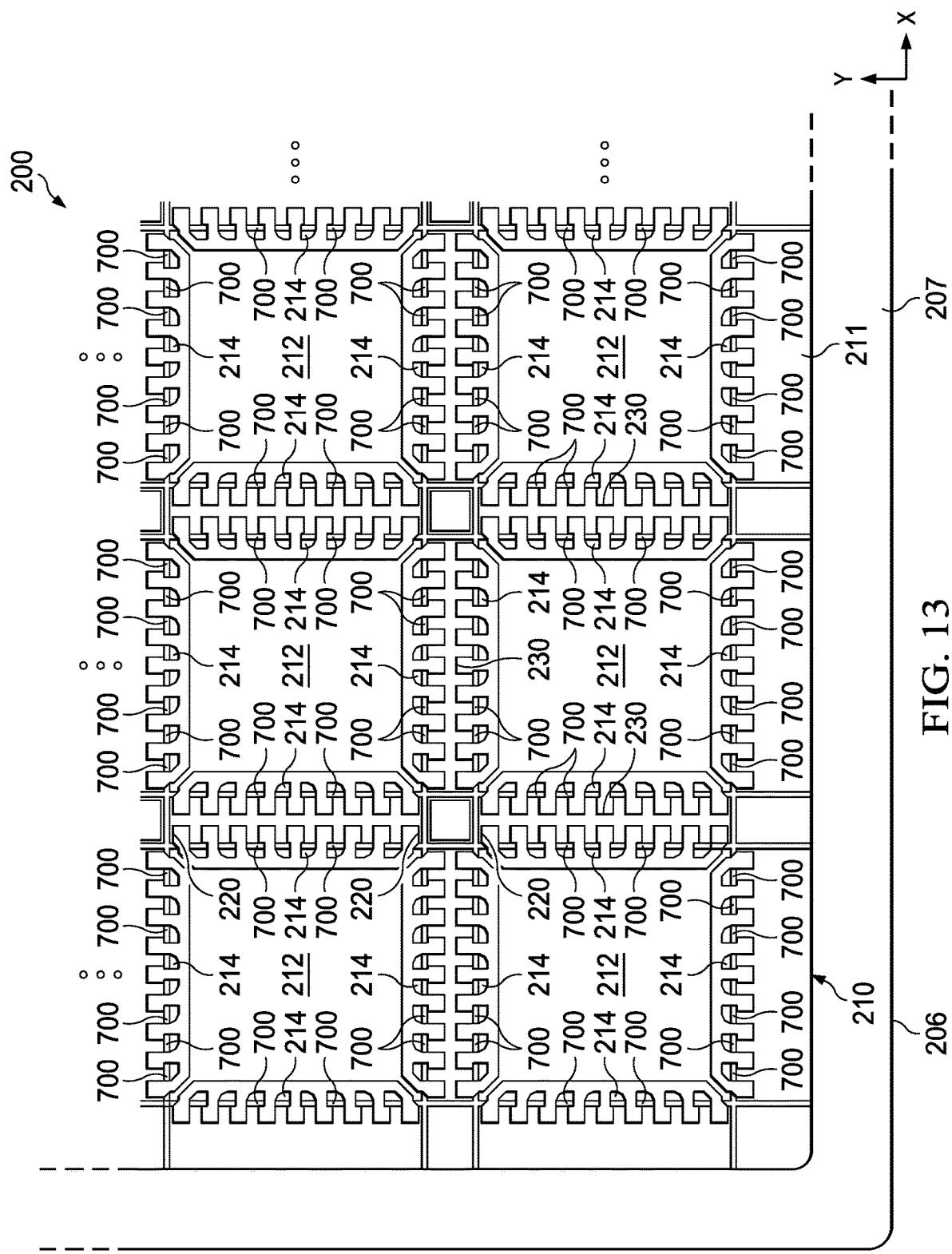
FIG. 13 is a partial top plan view of the lead frame processing system of FIG. 2 after the roller is rolled in the second direction to form a second set of indent features in leads of the bottom side of the lead frame.

Referring also to FIGS. 12 and 13, additional rolling operations are illustrated in one example, using the same roller 201 described above. FIG. 12 shows the lead frame processing system of FIG. 2 with the roller positioned for rolling in a second direction (in the negative Y direction) along a second set of protrusion paths 1200. The roller 201 of FIG. 2, having the continuous protrusions 202, is used for the Y direction rolling in this example (108 in FIG. 1 above), with the protrusions 202 aligned with the paths 1200. For the second rolling step, the position controller 204 again controls the translation of the roller 201 along the direction 205 while monitoring the roller position and controlling the downward (Z axis) pressure applied by the roller 201 to the side 211 of the lead frame 210 to achieve or maintain the desired final lead frame thickness (e.g., T2 in FIGS. 3, 4, 6, 8, and 10 above). FIG. 13 shows the lead frame 210 after the roller 201 is rolled in the negative Y direction to form a second set of indent features 700 in leads 214 oriented along the left and right sides of the individual integrated circuit sections on the bottom side 211 of the lead frame 210.

Figure 15:
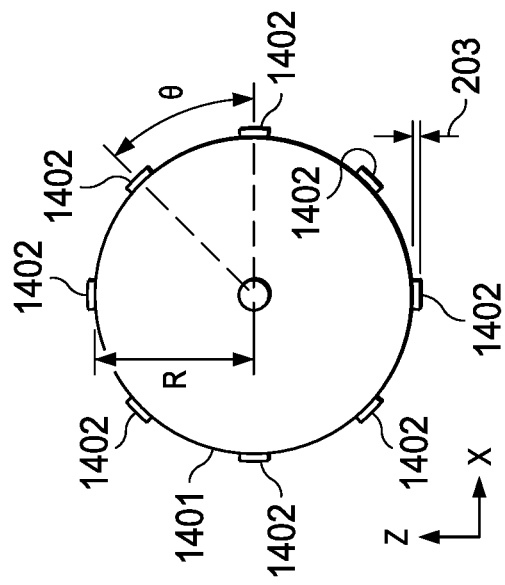
FIG. 15 is a partial side elevation view of the roller of FIG. 14.
Figure 14:
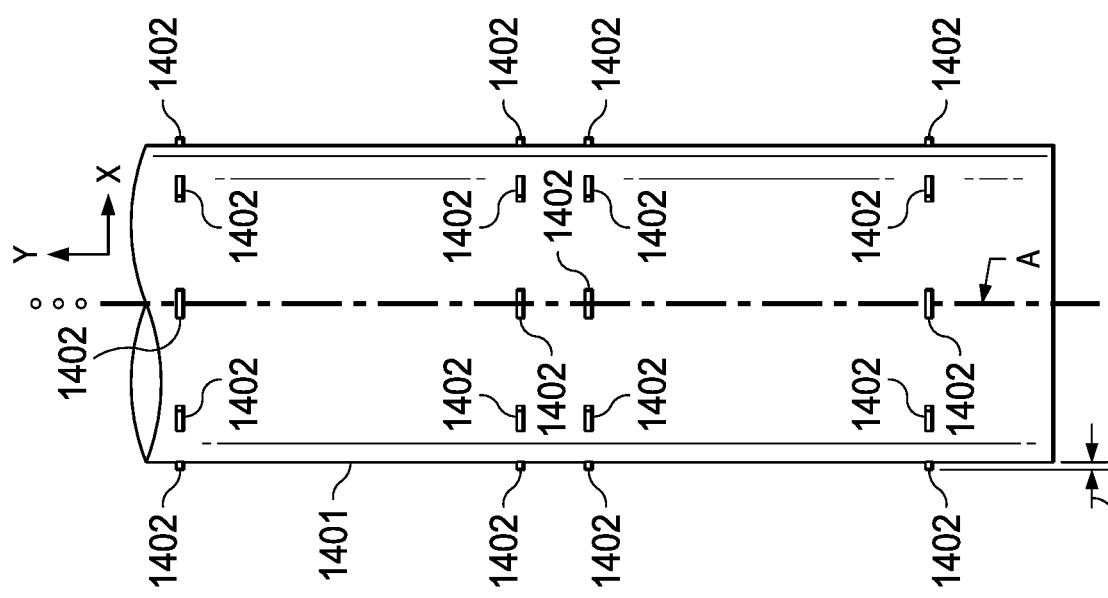
FIG. 14 is a partial top plan view of another roller with protrusions having discontinuities.

Referring also to FIGS. 14 and 15, further rolling steps are performed in certain examples, using the same or a different roller, in any corresponding direction in the X-Y plane, to form further indented features in either or both sides 211, 300 of the lead frame 210. FIG. 14 shows a partial top plan view of a roller 1401 with a cylindrical body extending along an axis A, as well as discontinuous protrusions 1402. FIG. 15 shows a partial side elevation view of the roller 1401 of FIG. 14. In this example, the individual protrusions 1402 do not extend throughout the entire circumference of the cylindrical roller, and instead include discontinuities. In other examples, protrusions with discontinuities are combined with continuous protrusions. In certain implementations, the protrusions can have different heights 203, as well as profiled heights that have different values at different locations around the circumference of the cylindrical body of the roller 1401. In one implementation, a roller includes a single protrusion, whether continuous or having discontinuities. In other implementations (e.g., FIGS. 2-4, 14 and 15) include multiple protrusions 202, 1402. The examples of FIGS. 2-4, 14 and 15 have protrusions 202, 1402 that extend radially around all or a portion of the circumference of the cylindrical body, without any deviation in the direction of the axis A. In another implementation (not shown), the roller includes one or more protrusions with a shape that varies along the axial direction around all or a portion of the circumference of the cylindrical body. The lead frame processing system 200 and the method 100 described above facilitate creation of mold locking features to mitigate or avoid delamination and provide significant cost savings and lead time benefits compared with lead frame etching and/or lead frame stamping operations and equipment.

Figure 16:
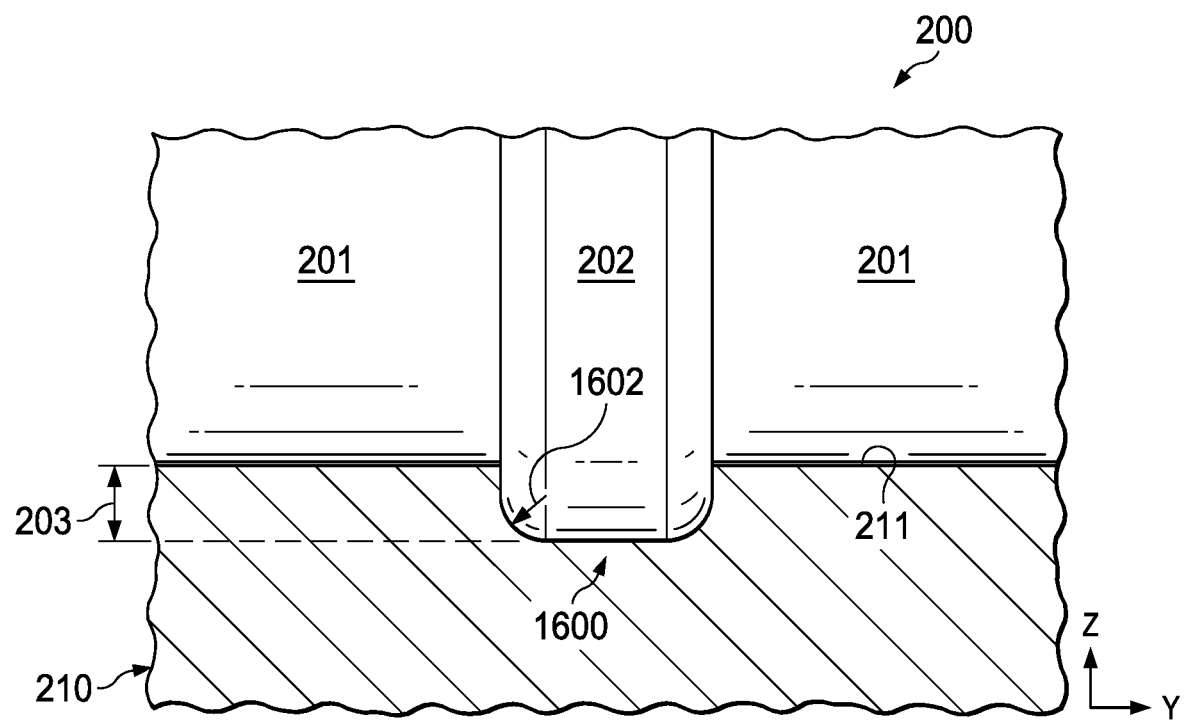
FIG. 16 is a partial end elevation view of a portion of the roller of FIG. 2 with a roller protrusion creating a rolled indent with a rounded portion in a lead feature on the bottom side of the lead frame.
Figure 17:
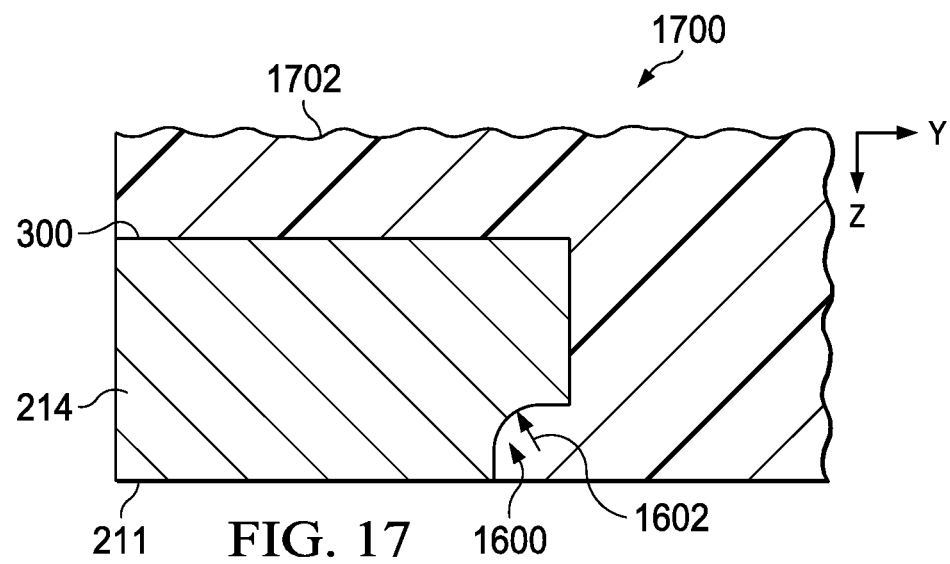
FIG. 17 is a partial side elevation view of a portion of an integrated circuit with the rolled indent created in FIG. 16 providing a mold locking feature in a lead feature to mitigate delamination of molding compound from the lead feature.

Referring also to FIGS. 16-23, the rolled indents 700 have indented shapes or profiles that conform to the shapes of the corresponding roller protrusions 202 in the roller 201 described above. Different roller implementations include one or more differently shaped or profiled protrusions, examples of which are shown in FIGS. 16-23. FIGS. 16 and 17 show further details of one example of the roller 201 in FIG. 2. The protrusion 202 in FIG. 16 includes a dual radiused protrusion 202 that creates a rolled indent 1600 with two rounded portions, each having a radius 1602 in a lead feature 214 on the bottom side 211 of the lead frame 210. FIG. 17 shows a sectional view of a portion of an example integrated circuit 1700 fabricated using the lead frame 210 with the rolled indent 1600. In this example, the portion of the lead frame 210 indented by the roller 201 is in a boundary region between two adjacent integrated circuit portions of the lead frame 210, which is ultimately separated into separate portions. FIG. 17 shows a portion of the final integrated circuit 1700 after molding, in which the lead feature 214 includes the indent 1600 having the radius 1602. FIG. 17 also shows a molded material (e.g., molding compound) 1702 that extends into the indent 1600 to provide a mold locking feature in a lead feature 214 to mitigate delamination of molding compound from the lead feature 214.

Figure 18:
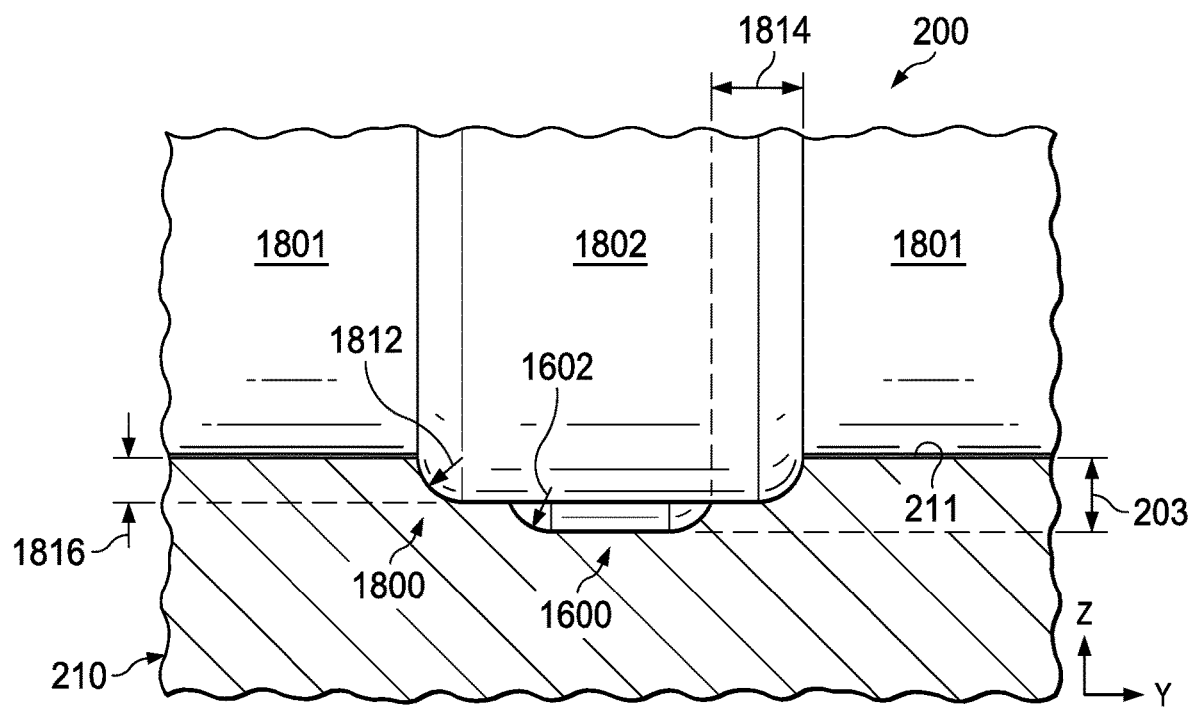
FIG. 18 is a partial end elevation view of a portion of another roller with a lower and wider protrusion creating a second rolled indent with a rounded portion to provide a terraced multi-step indent in a lead feature of FIGS. 16 and 17 on the bottom side of the lead frame.
Figure 19:
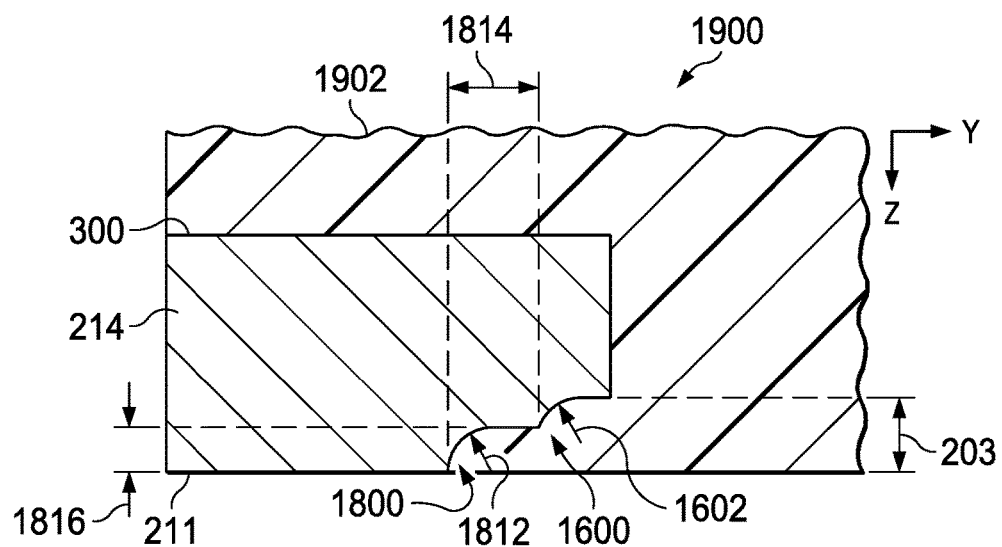
FIG. 19 is a partial side elevation view of a portion of an integrated circuit with the rolled indents created in FIGS. 16 and 18 providing a terraced multi-step mold locking feature in a lead feature to mitigate delamination of molding compound from the lead.

FIGS. 18 and 19 show another example in which a portion of a roller 1801 is shown including a with a lower and wider protrusion 1802. The second protrusion 1802 has a corner radius 1812 that can be the same or different from the radius 1602 of the first protrusion 202. In this example, the second roller 1801 is used to provide a subsequently rolled indent 1800 that overlaps the previously formed indent 1600 to provide a stepped or terrace composite indent. In this example, the axial length of the second protrusion 1802 is greater than that of the first protrusion 202 (FIG. 16), and the edge of the second protrusion 1802 is spaced by a spacing distance 1814 from the corresponding lateral edge of the first protrusion 202 of the first roller 201. In addition, the protrusion 1802 of the second roller 1801 extends by a smaller distance 1816 radially outward from the cylindrical body thereof and the second protrusion distance 1816 is less than the first protrusion distance 203. FIG. 18 shows a two-sided resulting terraced multi-step indent 1600, 1800 in the lead feature 214 of FIGS. 16 and 17 on the bottom side 211 of the lead frame 210. FIG. 19 shows a portion of an integrated circuit 1900 that includes the lead feature 214 with the rolled indents 1600 and 1800 created in FIGS. 16 and 18 providing a terraced multi-step mold locking feature after device separation and molding to mitigate or prevent delamination of the molding compound 1902 from the lead frame 210.

Figure 20:
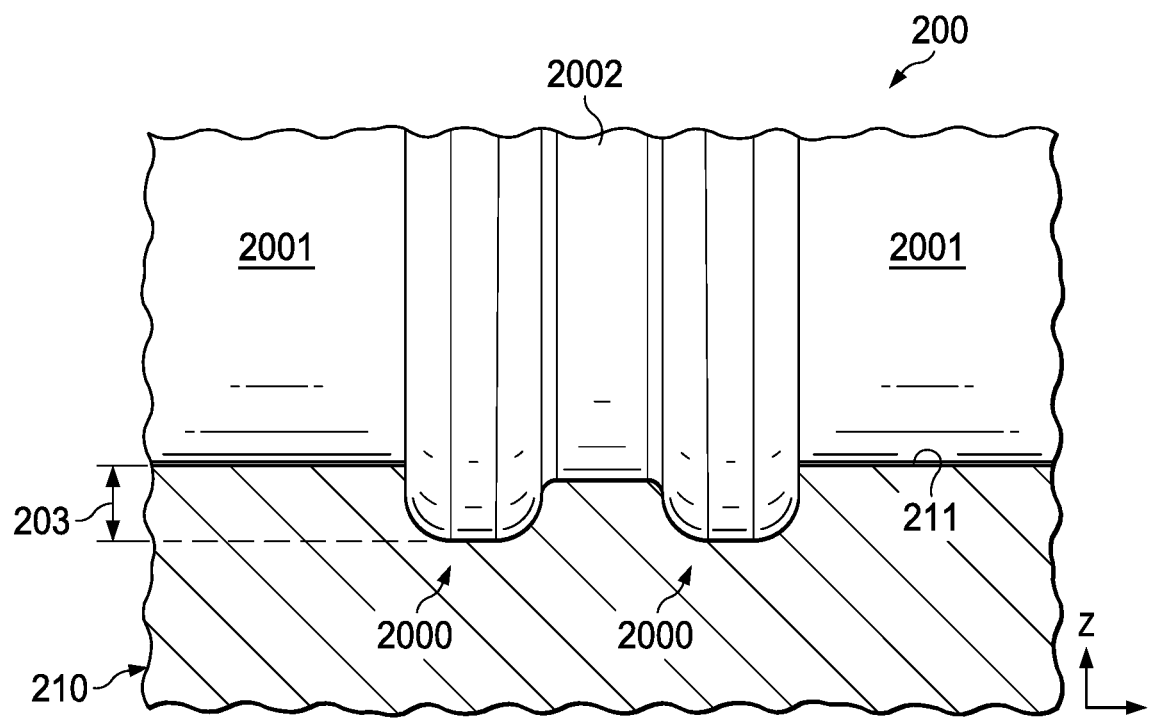
FIG. 20 is a partial end elevation view of a portion of another roller with a different roller protrusion creating a curvilinear rolled indent in a lead feature on the bottom side of the lead frame.
Figure 21:
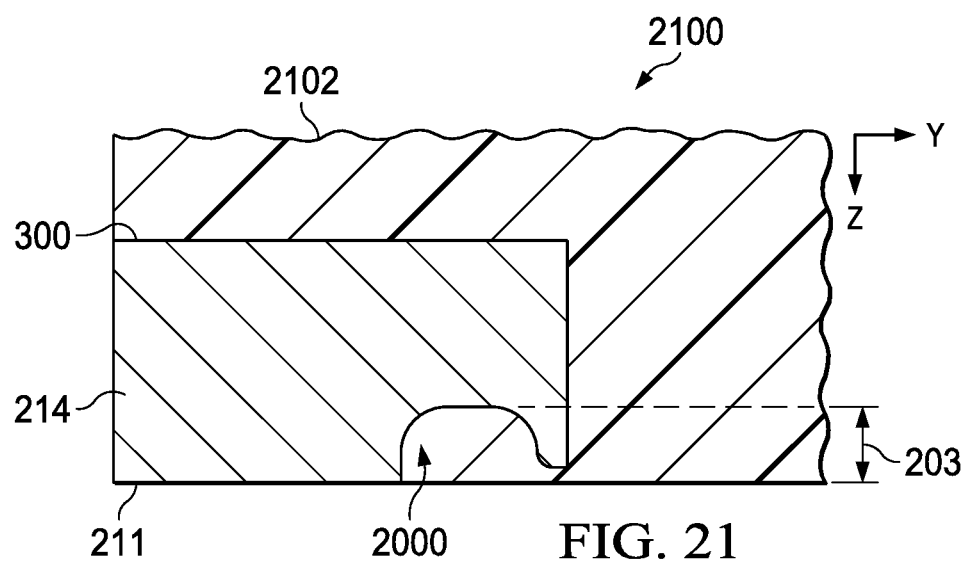
FIG. 21 is a partial side elevation view of a portion of an integrated circuit with the rolled indent created in FIG. 20 providing a mold locking feature in the lead.

FIGS. 20 and 21 show another example, in which the roller 2001 has a protrusion 2002 with axially spaced lobes that contemporaneously create an indent with radiused portions 2000. FIG. 21 shows a portion of an integrated circuit 2100 with one of the lobes of the rolled indent 2000 created in FIG. 20. The indent 2000 in this example provides an undercut feature in the IC lead 214 to prevent or mitigate delamination of molding material 2102 from the lead 214.

Figure 22:
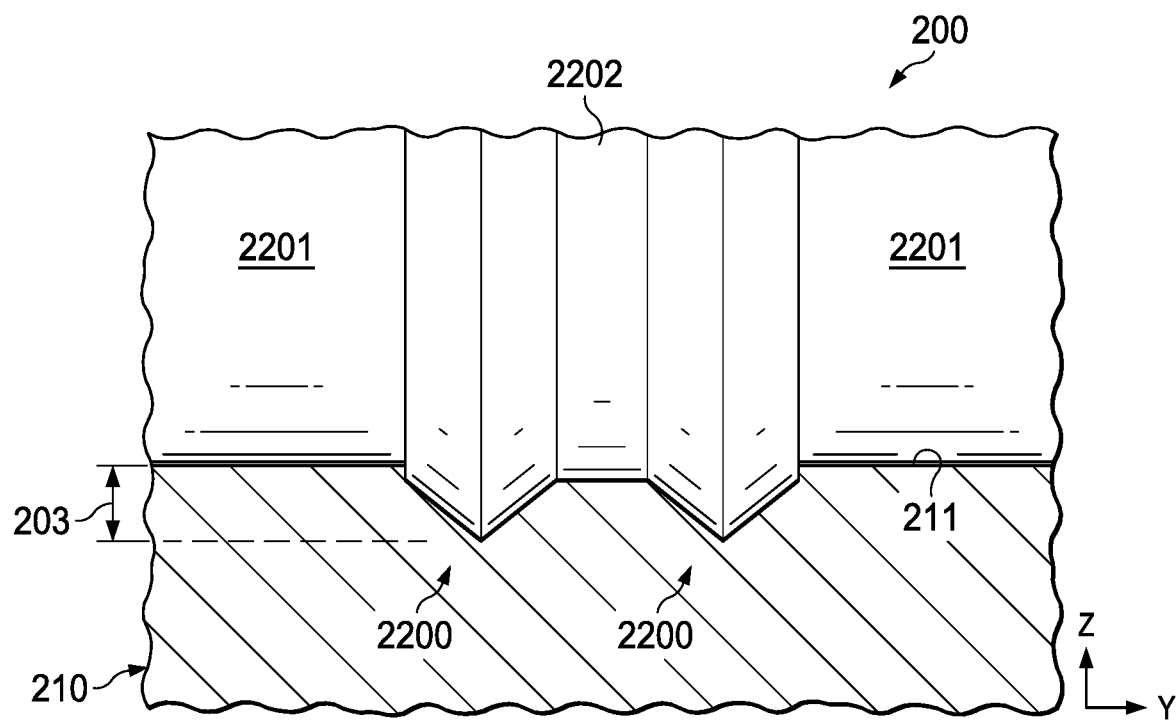
FIG. 22 is a partial end elevation view of a portion of yet another roller with a conical pointed roller protrusion creating a v-shaped rolled indent in a lead on the bottom side of the lead frame.
Figure 23:
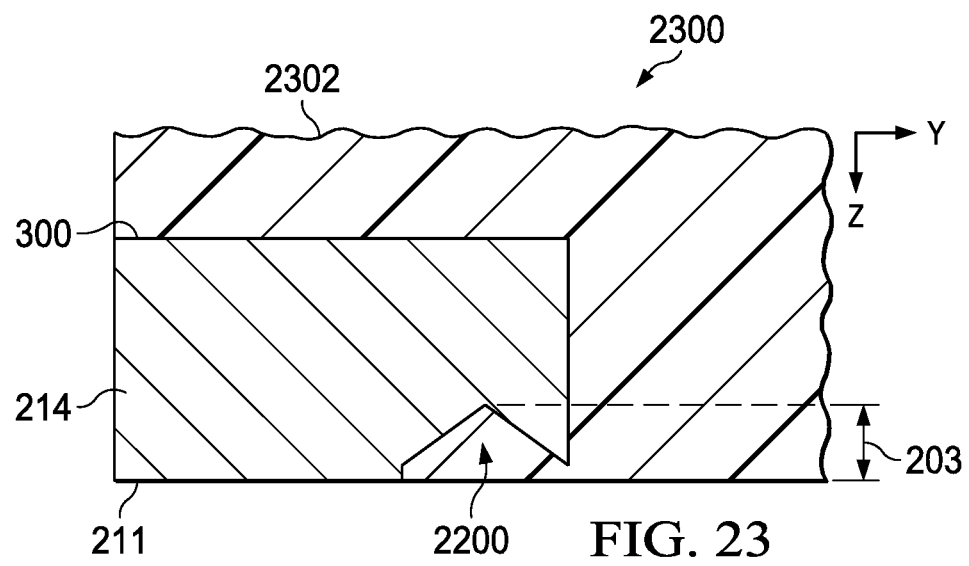
FIG. 23 is a partial side elevation view of a portion of an integrated circuit with the rolled indent created in FIG. 22 providing a pointed mold locking feature in the lead.

Another example is shown in FIGS. 22 and 23. FIG. 22 shows another example roller 2201 with a protrusion 2202 having two axially spaced pointed or v-shaped features to create indents 2200 in the lead frame 210. FIG. 23 shows a portion of an integrated circuit 2300 with the rolled indent 2200 created by the roller 2201 in FIG. 22, where the indent 2200 is filled with molding compound 2302.

Figure 26:
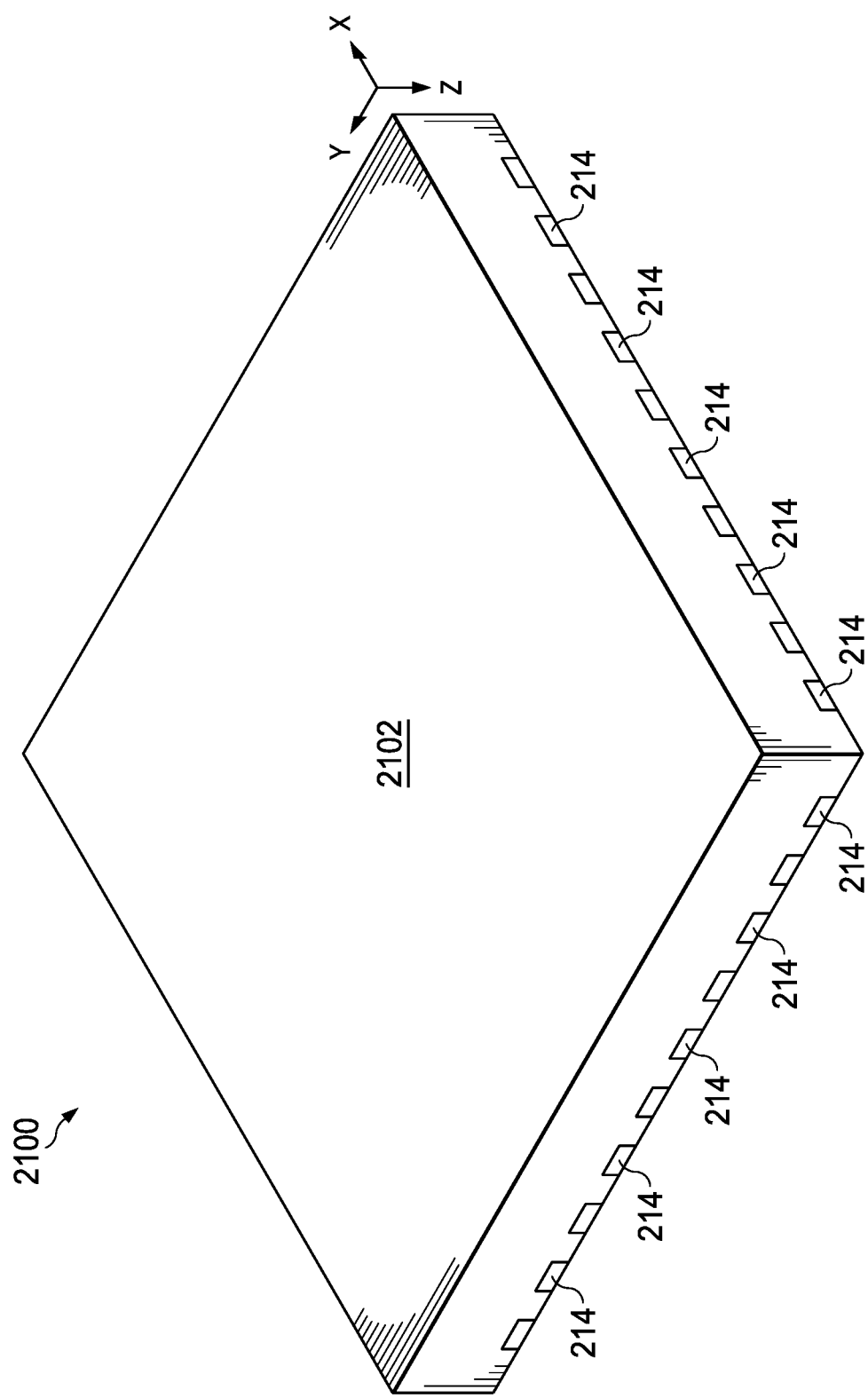
FIG. 26 is a top perspective view of a finished integrated circuit with the leads of FIGS. 16 and 17 after a molding process.

FIGS. 24-26 illustrate additional portions of the packaging processing 110 in the method 100 of FIG. 1. As previously discussed, the method 100 includes various steps and acts for processing a lead frame, including creating a rolled indent (e.g., indents 700, 1600, 1800, 2200 described above) in a feature of a starting lead frame (e.g., a lead feature, a die attach pad feature, a dam bar feature, a tie bar feature).

FIG. 24 shows an example die attach process 2400 (e.g., at 112 in the method 100 of FIG. 1) using the above described lead frame 210 with prospective lead features 214 having rolled indents 700 created by the protrusions 202 of the roller 201. In one example, the various features (e.g., the die attach pad 212 and the leads 214) are supported on a carrier tape or other structure (not shown in FIG. 24) during the die attach processing at 112, and the subsequent wire bonding at 114 in FIG. 1 above. The die attach process 2400 in this example includes applying conductive epoxy to a portion of a top side of the die attach pad feature to 12 of the lead frame 210, and attaching a bottom side of a semiconductor die 2402 to the epoxy portion of the top side of the die attach pad 212. The semiconductor die 2402 includes die pads or other conductive features 2403 on the topside of the semiconductor die 2402.

FIG. 25 shows a wire bonding process 2500 performed (e.g., 114 in FIG. 1) while the lead frame 210 is supported by a carrier tape, following die attach processing. The wire bonding process 2500 in this example couples a first and of a bond wire 2502 to the conductive feature 2403 of the semiconductor die 2402, and couples a second end of the bond wire 2502 to a portion of the top side 300 of the lead feature 214. Similar bond wires can be formed by other semiconductor die pads 2403 and corresponding lead features 214. The packaging processing 110 in FIG. 1 further includes molding and device singulation at 116. FIG. 26 shows a perspective view of a packaged integrated circuit electronic device 2100 (e.g., a quad flat no lead or QFN package) with a molded package structure 2102 that encloses the semiconductor die 2402, the bond wires 2502, a first portion of the leads 214, and a first portion of the die attach pad 212. The package structure 2102 exposes laterally outward and bottom side second portions of the leads 214 and a bottom portion of the die attach pad 212 (not shown in FIG. 26).

As seen in FIGS. 24-26, the integrated circuit 2100 includes the die attach pad 212, the semiconductor die 2402 on the first side 211 of the die attach pad 212, the leads 214, the bond wires 2502, and the package structure 2102. In addition, the integrated circuit 2100 also includes the rolled indents 700 in the first portions of the leads 214. In other implementations, rolled indents are provided in one or more features of a starting stamped or etched lead frame, including without limitation one or more leads, die attach pads, tie bars and/or dam bars (not shown).

Referring also to FIGS. 27-29, in other implementations, rolled indents are provided in other features of a lead frame. These rolled indents can be provided alone or in combination with indents formed in lead features of lead frame as discussed above. FIG. 27 shows a side view of another implementation of the lead frame 210 with rolled indents 2700 in a first portion of a die attach pad feature 212 of the lead frame 210. FIG. 28 shows a partial side view of another implementation of the lead frame 210 with rolled indents 2800 in a dam bar feature 220 of the lead frame 210. FIG. 29 shows a partial side view of yet another implementation of the lead frame 210 with rolled indents 2900 in a tie bar feature 230 of the lead frame 210.

The use of rollers facilitates reducing or avoiding delamination or other separation of molded material from one or more features of the starting lead frame and/or from the semiconductor die. In addition, the rolling techniques and systems provide a low-cost solution to help prevent delamination without the high cost and long lead times associated with lead frame etching approaches and/or lead frame stamping techniques. In addition, the rolling approach allows creation of rolled indents on a lead frame with shapes in profiles that cannot be feasibly created using stamping or etching approaches, and thus provides additional options for combating delamination of the finished integrated circuit or other packaged electronic device. Moreover, the selective formation of rolled indents in a lead frame can be used for other purposes beyond delamination prevention, for example, to create thinner areas of a lead frame to facilitate subsequent sawing, laser etching, or other device separation or singulation operations, alone, or in addition to selective indent creation to facilitate mold locking or otherwise combat delamination.

Modifications are possible in the described examples, and other implementations are possible, within the scope of the claims.

What is claimed is:

1. A method, comprising:
using a roller with a continuous protrusion around the roller, rolling the roller across a side of a stamped or etched lead frame including a lead, the continuous protrusion configured to create a groove across the lead of the lead frame as a result of rolling the roller, the groove being formed entirely within the lead as a complementary indentation produced by the continuous protrusion of the roller at a position within the lead coincident with a position of the continuous protrusion on the roller, wherein the lead includes a first portion having a first thickness and connected to a first side of the groove, a second portion having the first thickness and connected to a second side of the groove opposite the first side, and a third portion corresponding to the groove having a second thickness less than the first thickness;
attaching a semiconductor die to a die attach pad of the lead frame;
electrically coupling the semiconductor die with the lead of the lead frame; and
enclosing portions of the semiconductor die, the die attach pad, and a portion of the lead with a molding compound.

2. The method of claim 1, further comprising:
engaging a second side of the lead frame with a side of a chuck while rolling the roller across the side of the lead frame; and
controlling a temperature of the chuck while rolling the roller across the side of the lead frame.

3. The method of claim 2, further comprising:
controlling a pressure applied by the roller to the side of the lead frame while rolling the roller across the side of the lead frame to set a final thickness of the lead frame that is less than a starting thickness of the lead frame.

4. The method of claim 3, further comprising:
after rolling the roller across the side of the lead frame; and
using a second roller with a second protrusion, rolling the second roller across the side of the lead frame to create a second groove in the lead or another feature of the lead frame.

5. The method of claim 2, further comprising:
after rolling the roller across the side of the lead frame; and
using a second roller with a second protrusion, rolling the second roller across the side of the lead frame to create a second groove in the lead or another feature of the lead frame.

6. The method of claim 1, further comprising:
controlling a pressure applied by the roller to the side of the lead frame while rolling the roller across the side of the lead frame to set a final thickness of the lead frame that is less than a starting thickness of the lead frame.

7. The method of claim 1, further comprising:
after rolling the roller across the side of the lead frame; and
using a second roller with a second protrusion, rolling the second roller across the side of the lead frame to create a second groove in the lead or another feature of the lead frame.

8. The method of claim 1, wherein the roller further comprises:
at least one additional protrusion on the roller and spaced apart from the continuous protrusion.

9. The method of claim 8, wherein the at least one additional protrusion on the roller is a continuous protrusion.

10. A method, comprising:
rolling a roller with a continuous protrusion around the roller across a side of a stamped or etched lead frame including a lead, the continuous protrusion configured to create a groove across the lead of the lead frame as a result of rolling the roller, the groove being formed entirely within the lead as a complementary indentation produced by the continuous protrusion of the roller at a position within the lead coincident with a position of the continuous protrusion on the roller, wherein the lead includes a first portion having a first thickness and connected to a first side of the groove, a second portion having the first thickness and connected to a second side of the groove opposite the first side, and a third portion corresponding to the groove having a second thickness less than the first thickness.

11. The method of claim 10, further comprising:
attaching a semiconductor die to a die attach pad of the lead frame.

12. The method of claim 11, further comprising:
electrically coupling the semiconductor die with the lead of the lead frame.

13. The method of claim 11, further comprising:
covering portions of the semiconductor die, the die attach pad, and a portion of the lead with a molding compound.

14. The method of claim 10, further comprising:
engaging a second side of the lead frame with a side of a chuck while rolling the roller across the side of the lead frame; and
controlling a temperature of the chuck while rolling the roller across the side of the lead frame.

15. The method of claim 14, further comprising:
controlling a pressure applied by the roller to the side of the lead frame while rolling the roller across the side of the lead frame to set a final thickness of the lead frame that is less than a starting thickness of the lead frame.

16. The method of claim 10, further comprising:
after rolling the roller across the side of the lead frame; and
using a second roller with a second protrusion, rolling the second roller across the side of the lead frame to create a second groove in the lead.

17. The method of claim 10, further comprising:
after rolling the roller across the side of the lead frame, engaging the side of the lead frame with a side of a chuck; and
rolling the roller or another roller across a second side of the lead frame to create a second groove in the lead or another feature of the lead frame.

18. The method of claim 10, further comprising:
after rolling the roller across the side of the lead frame; and
using a second roller with a second protrusion, rolling the second roller across the side of the lead frame to create a second groove in another feature of the lead frame.

19. The method of claim 10, further comprising:
controlling a pressure applied by the roller to the side of the lead frame while rolling the roller across the side of the lead frame to set a final thickness of the lead frame that is less than a starting thickness of the lead frame.

20. The method of claim 10, further comprising:
after rolling the roller across the side of the lead frame; and
using a second roller with a second protrusion, rolling the second roller across the side of the lead frame to create a second groove in the lead or another feature of the lead frame.

21. The method of claim 10, wherein the roller further comprises:
at least one additional protrusion on the roller and spaced apart from the continuous protrusion.

22. The method of claim 21, wherein the at least one additional protrusion on the roller is a continuous protrusion.

23. A method, comprising:
rolling a roller with a continuous protrusion around the roller across a side of a stamped or etched lead frame including a die attach pad, the continuous protrusion configured to create a groove across the die attach pad of the lead frame as a result of rolling the roller, the groove being formed entirely within the die attach pad as a complementary indentation produced by the continuous protrusion of the roller at a position within the die attach pad coincident with a position of the continuous protrusion on the roller, wherein the die attach pad includes a first portion having a first thickness and connected to a first side of the groove, a second portion having the first thickness and connected to a second side of the groove opposite the first side, and a third portion corresponding to the groove having a second thickness less than the first thickness.

24. The method of claim 23, further comprising:
after rolling the roller across the side of the lead frame; and
using a second roller with a second protrusion, rolling the second roller across the side of the lead frame to create a second groove in the die attach pad or another feature of the lead frame.

25. The method of claim 23, further comprising:
after rolling the roller across the side of the lead frame; and
using a second roller with a second protrusion, rolling the second roller across the side of the lead frame to create a second groove in the die attach pad.

26. The method of claim 23, further comprising:
after rolling the roller across the side of the lead frame, engaging the side of the lead frame with a side of a chuck; and
rolling the roller or another roller across a second side of the lead frame to create a second groove in another feature of the lead frame.

* * * * *